(12) United States Patent
Schwartz et al.

(10) Patent No.: US 10,387,534 B2
(45) Date of Patent: Aug. 20, 2019

(54) FAST MATRIX MULTIPLICATION AND LINEAR ALGEBRA BY ALTERNATIVE BASIS

(71) Applicant: YISSUM RESEARCH DEVELOPMENT COMPANY OF THE HEBREW UNIVERSITY OF JERUSALEM LTD., Jerusalem (IL)

(72) Inventors: Oded Schwartz, Kiryat Ono (IL); Elaye Karstadt, Qazir (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 0 days.

(21) Appl. No.: 15/823,776

(22) Filed: Nov. 28, 2017

(65) Prior Publication Data

US 2018/0150431 A1    May 31, 2018

Related U.S. Application Data

(60) Provisional application No. 62/427,039, filed on Nov. 28, 2016.

(51) Int. Cl.
*G06F 17/16* (2006.01)
*H03M 13/00* (2006.01)
(Continued)

(52) U.S. Cl.
CPC .......... *G06F 17/16* (2013.01); *G06F 9/30036* (2013.01); *G06F 17/12* (2013.01); *H03M 13/616* (2013.01)

(58) Field of Classification Search
CPC ...... G06F 17/12; G06F 9/30036; G06F 17/16; H03M 13/616
(Continued)

(56) References Cited

U.S. PATENT DOCUMENTS

2014/0192936 A1* 7/2014 Fukawa ............... H04B 7/0854
375/341

OTHER PUBLICATIONS

Austin R. Benson et al: "A framework for practical parallel fast matrix multiplication", ACM SIGPLAN Notices, vol. 50, No. 8, Aug. 2015, pp. 42-53.
(Continued)

*Primary Examiner* — Tan V Mai
(74) *Attorney, Agent, or Firm* — The Roy Gross Law Firm, LLC; Roy Gross

(57) ABSTRACT

A computerized method comprising operating one or more hardware processor for receiving a first matrix and a second matrix. The hardware processor(s) are operated for determining a basis transformation, wherein the basis transformation is invertible to an inverted basis transformation. The hardware processor(s) are operated for computing an alternative basis first matrix by multiplying the first matrix by the basis transformation. The hardware processor(s) are operated for computing an alternative basis second matrix by multiplying the second matrix by the basis transformation. The hardware processor(s) are operated for performing a matrix multiplication of the alternative basis first matrix and the alternative basis second matrix, thereby producing an alternative basis multiplied matrix. The hardware processor(s) are operated for computing a multiplied matrix by multiplying the alternative basis multiplied matrix by the inverted basis transformation.

20 Claims, 5 Drawing Sheets

(51) Int. Cl.
*G06F 9/30* (2018.01)
*G06F 17/12* (2006.01)
(58) Field of Classification Search
USPC .......................................................... 708/607
See application file for complete search history.

(56) References Cited

OTHER PUBLICATIONS

Marco Bodrato: "A Strassen-like Matrix Multiplication Suited for Squaring and Higher Power Computation", Proceedings of the 2010 International Symposium on Symbolic and Algebraic Computation, ACM, Jul. 2010, pp. 273-280.
S. Frank Chang et al: "A hierarchical algorithm for making sparse matrices sparser", Mathematical Programming, vol. 56, 1992, pp. 1-30.
John R. Gilbert et al: "The Analysis of a Nested Dissection Algorithm", Numerische Mathematik, vol. 50, No. 4, Jul. 1986, pp. 377-404.
A. V. Smirnov: "The Bilinear Complexity and Practical Algorithms for Matrix Multiplication", Computational Mathematics and Mathematical Physics, vol. 53, No. 12, Dec. 2013, pp. 1781-1795.
Volker Strassen: "Gaussian Elimination is not Optimal", Numerische Mathematik, vol. 13, No. 4, Aug. 1969, pp. 354-356.

* cited by examiner

FAST MATRIX MULTIPLICATION AND LINEAR ALGEBRA BY ALTERNATIVE BASIS

CROSS-REFERENCE TO RELATED APPLICATIONS

This application claims the benefit of priority of U.S. Provisional Patent Application No. 62/427,039, filed Nov. 28, 2016, entitled "New method for faster matrix multiplication and most other numerical linear algebra kernels", which is incorporated herein by reference in its entirety.

BACKGROUND

The invention relates to the field of computerized mathematics.

Matrix multiplication and/or linear algebra is used in a wide range of computerized applications, from image processing to genetic analysis. For example, computers are often called upon to solve systems of linear equations, many times with many more than two variables. Even more frequently, they are called upon to multiply matrices. For example, matrix multiplication is used in cryptography, random numbers, error correcting codes, and image processing. One example is in cryptanalysis, where chained operations described as matrices must be multiplied together before being analyzed for flaws. Another example is in the design of random-number generators, where exponentiation (i.e. repeated multiplication) of dense matrices is used to determine the period and quality of random number generators. We see the results of matrix mathematics in every computer-generated image that has a reflection, or distortion effects such as light passing through rippling water. For example, graphics cards use matrix mathematics to account for reflection and for refraction.

As a result of its wide usage, matrix multiplication is an integral feature of computer microprocessors, such as CPUs (Central Processing Units), GPUs (Graphic Processing Units), embedded processors, FPGAs (Field-Programmable Gate Arrays), and the like. Matrix multiplication may be part of a system kernel, such as an operating system kernel, a math library kernel, a graphics processing kernel, and/or the like. The matrix multiplication may be performed by a combination of hardware and software components that are coordinated to produce the matrix results, such as in parallel processor operating system kernels that use multiple hardware processors to perform matrix multiplications.

Many techniques have been developed to improve the computational efficiency, speed, memory use, communications use, etc., of computerized matrix multiplication. For example, Strassen's well-known matrix multiplication algorithm is a sub-cubic matrix multiplication algorithm, with a complexity of $0(n^{log_2 7})$. See Volker Strassen, "Gaussian elimination is not optimal", in *Numerische mathematik* 13, 4 (1969), 354-356. Winograd's matrix multiplication algorithm may reduce the leading coefficient from 7 to 6 by decreasing the number of additions and subtractions from 18 to 15. See Shmuel Winograd, "On multiplication of 2×2 matrices", in *Linear algebra and its applications* 4, 4 (1971), 381-388.

In practice, Strassen-Winograd's algorithm for matrix multiplication may perform better than some asymptotically faster algorithms due to these smaller hidden constants. The leading coefficient of Strassen-Winograd's algorithm may be optimal, due to a lower bound on the number of additions for matrix multiplication algorithms with 2×2 base case, obtained by Robert L. Probert, "On the additive complexity of matrix multiplication", in *SIAM J. Comput.* 5, 2 (1976), 187-203. As used herein, the term "additions" may be in some circumstances interchanged with the word "subtraction", as appropriate to the context.

Strassen-like algorithms are a class of divide-and-conquer algorithms which may utilize a base $\langle n_0, m_0, k_0; t \rangle$-algorithm: multiplying an $n_0 \times m_0$ matrix by an $m_0 \times k_0$ matrix using t scalar multiplications, where $n_0, m_0, k_0$ and t are positive integers. When multiplying an n×m matrix by an m×k matrix, an algorithm may split the matrices into blocks (such as each of size $$\frac{n}{n_0} \times \frac{m}{m_0} \text{ and } \frac{m}{m_0} \times \frac{k}{k_0},$$

respectively), and may proceed block-wise, according to the base algorithm. Additions and multiplication by a scalar in the base algorithm may be interpreted as block-wise additions. Multiplications in the base algorithm may be interpreted as block-wise multiplication via recursion. As used herein, a Strassen-like algorithm may be referred to by its base case. Hence, an $\langle n, m, k; t \rangle$-algorithm may refer to either the algorithm's base case or the corresponding block recursive algorithm, as obvious from context.

Recursive fast matrix multiplication algorithms with reasonable base case size for both square and rectangular matrices have been developed. At least some may have manageable hidden constants, and some asymptotically faster than Strassen's algorithm (e.g., Kaporin's implementation of Laderman algorithm; see Igor Kaporin, "The aggregation and cancellation techniques as a practical tool for faster matrix multiplication" in *Theoretical Computer Science* 315, 2-3, 469-510).

Recently, Smirnov presented several fast matrix multiplication algorithms derived by computer aided optimization tools, including an $\langle 6,3,3; 40 \rangle$-algorithm with asymptotic complexity of $0(n^{log_{54} 40^3})$, i.e. faster than Strassen's algorithm. See A V Smirnov, "The bilinear complexity and practical algorithms for matrix multiplication", in *Computational Mathematics and Mathematical Physics* 53, 12 (2013), 1781-1795. Ballard and Benson later presented several additional fast Strassen-like algorithms, found using computer aided optimization tools as well. They implemented several Strassen-like algorithms, including Smirnov's $\langle 6,3,3; 40 \rangle$-algorithm, on shared-memory architecture in order to demonstrate that Strassen and Strassen-like algorithms can outperform classical matrix multiplication in practice (such as Intel's Math Kernel Library), on modestly sized problems (at least up to n=13000), in a shared-memory environment. Their experiments also showed Strassen's algorithm outperforming Smirnov's algorithm in some of the cases. See Austin R. Benson and Grey Ballard, "A framework for practical parallel fast matrix multiplication" in *ACM SIGPLAN Notices* 50, 8 (2015), 42-53.

Bodrato introduced the intermediate representation method, for repeated squaring and for chain matrix multiplication computations. See Marco Bodrato, "A Strassen-like matrix multiplication suited for squaring and higher power computation", in *Proceedings of the 2010 International Symposium on Symbolic and Algebraic Computation*, ACM, 273-280. This enables decreasing the number of additions between consecutive multiplications. Thus, he obtained an algorithm with a 2×2 base case, which uses 7 multiplications, and has a leading coefficient of 5 for chain multiplication and for repeated squaring, for every multiplication outside the first one. Bodrato also presented an invertible linear function which recursively transforms a $2^k \times 2^k$ matrix to and from the intermediate transformation. While this is not the first time that linear transformations are applied to matrix multiplication, the main focus of previous research on the subject was on improving asymptotic performance rather than reducing the number of additions.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a computerized method comprising operating one or more hardware processor for receiving a first matrix and a second matrix. The hardware processor(s) are operated for determining a basis transformation, where the basis transformation is invertible to an inverted basis transformation. The hardware processor(s) are operated for computing an alternative basis first matrix by multiplying the first matrix by the basis transformation. The hardware processor(s) are operated for computing an alternative basis second matrix by multiplying the second matrix by the basis transformation. The hardware processor(s) are operated for performing a matrix multiplication of the alternative basis first matrix and the alternative basis second matrix, thereby producing an alternative basis multiplied matrix, where the matrix multiplication is configured for the basis transformation. The hardware processor(s) are operated for computing a multiplied matrix by multiplying the alternative basis multiplied matrix by the inverted basis transformation.

According to some embodiments, the basis transformation is determined by at least one of a heuristics, a computation, and a retrieval from a repository.

According to some embodiments, the basis transformation is determined by solving one or more sparsification problem.

According to some embodiments, the matrix multiplication comprises (i) a first encoding matrix for encoding the first matrix, (ii) a second encoding matrix for encoding the second matrix, and (iii) a decoding matrix for the alternative basis multiplied matrix, wherein the at least one sparsification problem is at least one from the group consisting of sparsification of the first encoding matrix, sparsification of the second encoding matrix, and sparsification of the decoding matrix.

According to some embodiments, the basis transformation is determined by simultaneously solving three sparsification problems, one for each of: the first encoding matrix, the second encoding matrix, and the decoding matrix.

According to some embodiments, each element of the basis transformation comprises one number from the group consisting of the numbers 1, 0, and −1.

According to some embodiments, the basis transformation is computed to sparsify encoding and decoding matrices of a specific matrix multiplication algorithm.

According to some embodiments, the hardware processor(s) are operated by a computer program product.

The computer program product comprises a non-transitory computer-readable storage medium having program code embodied therewith, the program code executable by the one or more hardware processor According to some embodiments, the hardware processor(s) are incorporated in a computerized system. The computerized system comprising a non-transitory computer-readable storage medium having the program code embodied therewith In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Disclosed herein are computerized methods, products, and systems for performing fast matrix multiplication. Two or more matrices are received by one or more hardware processors. A basis transformation is determined, such that the basis transformation is invertible. The basis transformation may be determined based on the matrix multiplier technique, and/or the like numerical matrix/vector operation. New matrices are computed, one for each of the two or more received matrices, using the basis transformation. The matrix multiplication is performed on the new matrices, and the resulting multiplied matrix is converted back using the inverted basis transformation and provided for further processing. This technique, which may increase the computational complexity due to the several basis transformations of the input matrices and an inverted basis transformation for the output matrix by low order term, but is, in total, computationally more efficient than existing algorithms for some configurations of matrix dimension denoted n, number of processors denoted P, local memory size denoted M, communication costs, and/or the like.

This technique may be applied to matrix multiplication algorithms of any size.

The technique may be applied to Numerical Linear Algebra applications, such as matrix inversion, matrix polynomials, matrix decompositions (e.g., Cholesky decomposition, LU decomposition, QR decomposition etc.), and/or the like.

Optionally, a mathematical operation involving less than or more than two matrices uses the disclosed techniques, such as matrix powers, matrix inversion, matrix decomposition, matrix polynomial computation, chain matrix multiplication, multivariate polynomial analysis, Hadamard matrix computation, Vandermonde matrices computation, tensor contraction, and/or the like.

Optionally, more than one basis transformation and modified respective algorithm are used for a single mathematical operation. For example, two permutations of a <3,3,6;40>-algorithm are used to produce a <54,54,54;1> algorithm.

Figure 1:
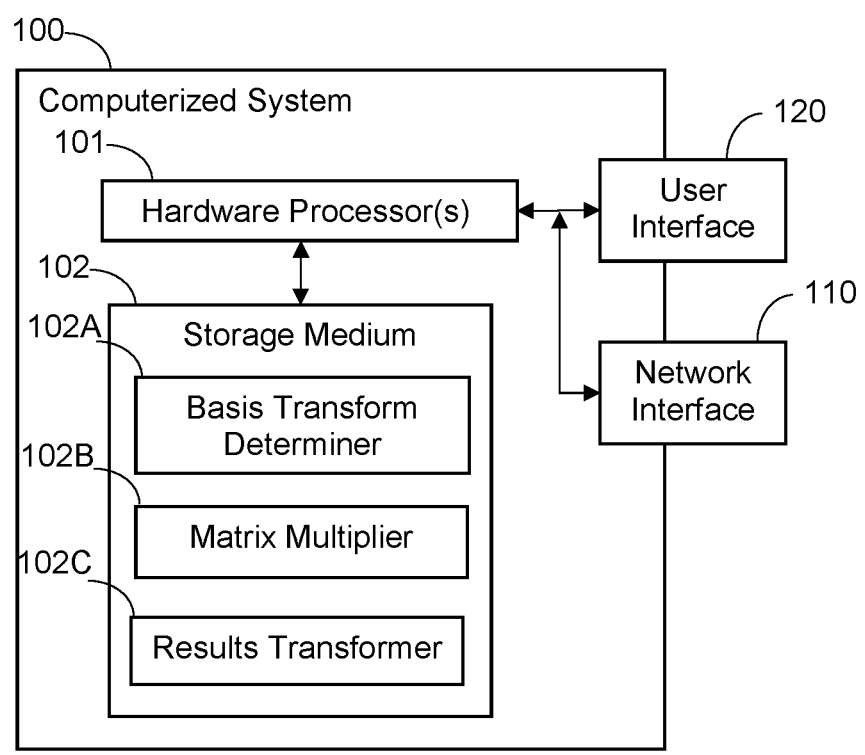
FIG. 1 shows schematically a computerized system for matrix multiplication using an alternative basis transform.
Figure 2A:
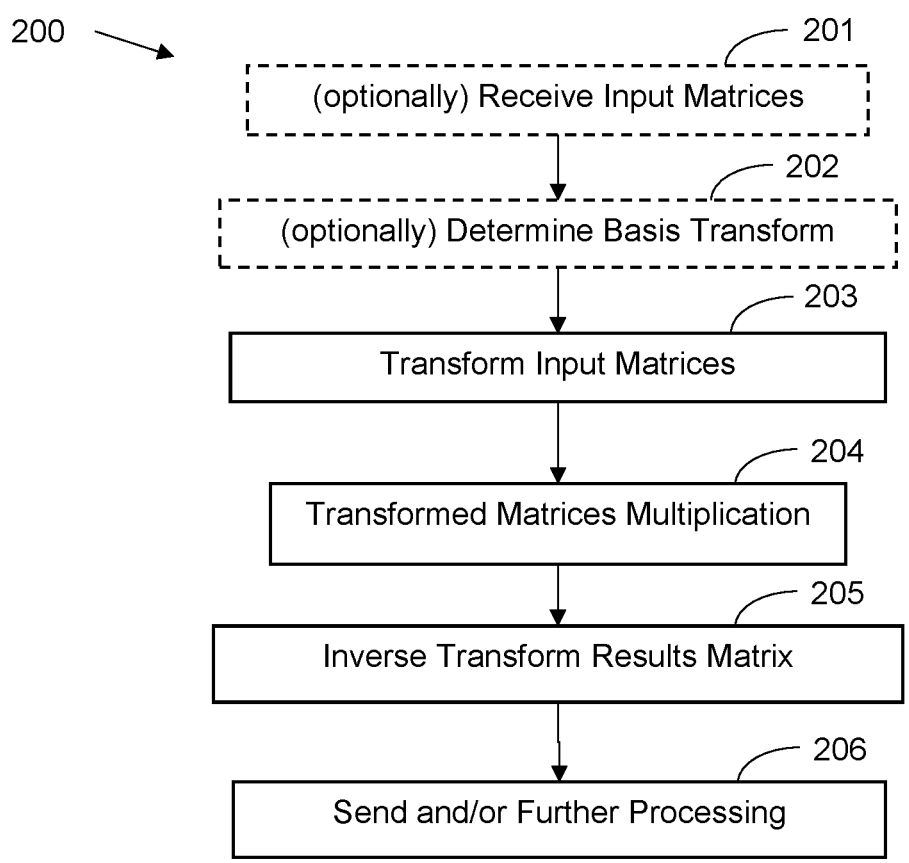
FIG. 2A shows a flowchart of a method for matrix multiplication using an alternative basis transform.

Reference is now made to FIG. 1, which shows schematically a computerized system 100 for matrix multiplication using an alternative basis transform, and to FIG. 2, which shows a flowchart 200 of a method for matrix multiplication using an alternative basis transform. These embodiments are examples of possible embodiments that utilize the disclosed technique, and other embodiments may be envisions, such as field-programmable gate arrays embodiments, and/or the like. For example, the method may compute a basis transformation a priori, on the fly, retrieved from a repository, provided as a service, and/or the like.

Computerized system 100 comprises one or more hardware processors 101, a user interface 120, a network interface 110, and one or more computer-readable, non-transitory, storage mediums 102. On non-transitory storage medium(s) 102 is stored program code, optionally organized in dedicated, specialized, non-standard software modules, that when executed on hardware processor(s) 101, cause hardware processor(s) 101 to perform non-standard actions resulting in matrix multiplication. The non-standard Basis Transform Determiner 102A optionally receives 201 input matrices, and based on the matrix multiplier technique, optionally determines 202 one or more basis transform, and applies the basis transform to transform 203 the input matrices. A Matrix Multiplier 102B multiplies 204 the transformed input matrices to produce a transformed results matrix, which is inverse transformed 205 by a non-standard Results Transformer 102C to produce the resulting multiplied matrix for further processing and/or sending 206 to other computers.

The basis transformation and respective modified algorithm may create a modified algorithm for faster processing of the matrix operation. As used herein, the matrix multiplication operation is used as an example, but other numerical operations may be used for any combination of matrices, vectors, tensors, and/or the like.

Figure 2B:
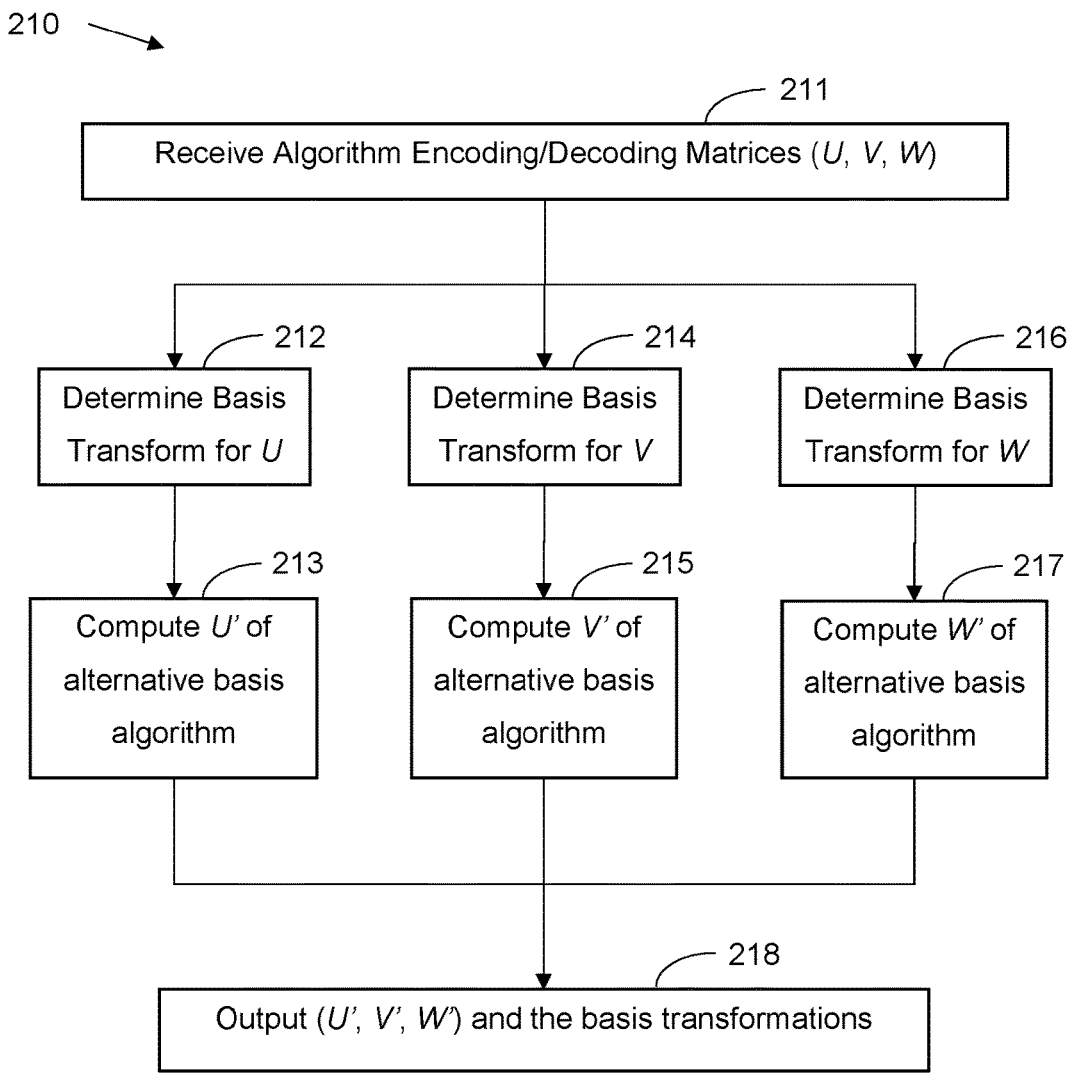
FIG. 2B shows a flowchart of a method for alternative basis transform determination.

Reference is now made to FIG. 2B, which shows a flowchart of a method 210 for alternative basis transform determination. A computerized system receives 211 the encoding/decoding matrices for a specific matrix multiplication algorithm, such as matrices U, V and W, where U denotes an encoding matrix for a first input matrix, V denotes an encoding matrix for a second input matrix, and W denotes a decoding matrix for a multiplication results matrix. A basis transformation is determined 212 for U, and an encoding matrix U' is computed 213 for the algorithm in the alternative basis. A basis transformation is determined 214 for V, and an encoding matrix V' is computed 215 for the algorithm in the alternative basis. A basis transformation is determined 216 for W, and a decoding matrix W' is computed 217 for the algorithm in the alternative basis. The encoding/decoding matrices in the alternative basis (U', V', and W') and the alternative basis transformations are outputted 218, such as stored to a repository, sent to a database, sent to a processing server, written to an FPGA, and/or the like.

An alternative term for encoding and/or decoding matrices may be coefficient matrices, as these matrices indicate the coefficients for the linear sums. For example, a matrix multiplication algorithm with 2×2 input matrix has a coefficient matrices row like 1 0 −1 1, which translates to the sum A11−A21+A22.

The terms encoding means that a multiplication is done by encoding each input into a number of multiplicands (for instance, 7, in Strassen's case). The term decoding means the results of the multiplication process is decoded into the actual result of the multiplication. For example, when an algorithm has t multiplications, the left-hand input is encoded into the t left hand multiplicands (S1, S2, . . . , St), and the right-hand input is encoded into the t right hand multiplicands (T1, T2, . . . , Tt). In this example, the multiplications are computed P1=S1*T1, P2=S2*T2, . . . , Pt=St*Tt. A decoding converts the results P1, . . . , Pt into the actual output values of the matrix multiplication algorithm.

As used herein, the terms encoding and/or decoding matrices, mean the matrices used for the bilinear transformation such as matrix multiplication algorithm. These may be augmented by basis transformation and inverse transformation matrices. The encoding/decoding matrices may be specifically computed based on the basis transformation to be applied to the specific matrix multiplication algorithm the basis transformation was computed for, such as a basis transformation that sparsifies the encoding and decoding matrices so that the matrix multiplication algorithm requires less arithmetic operations.

Figure 2C:
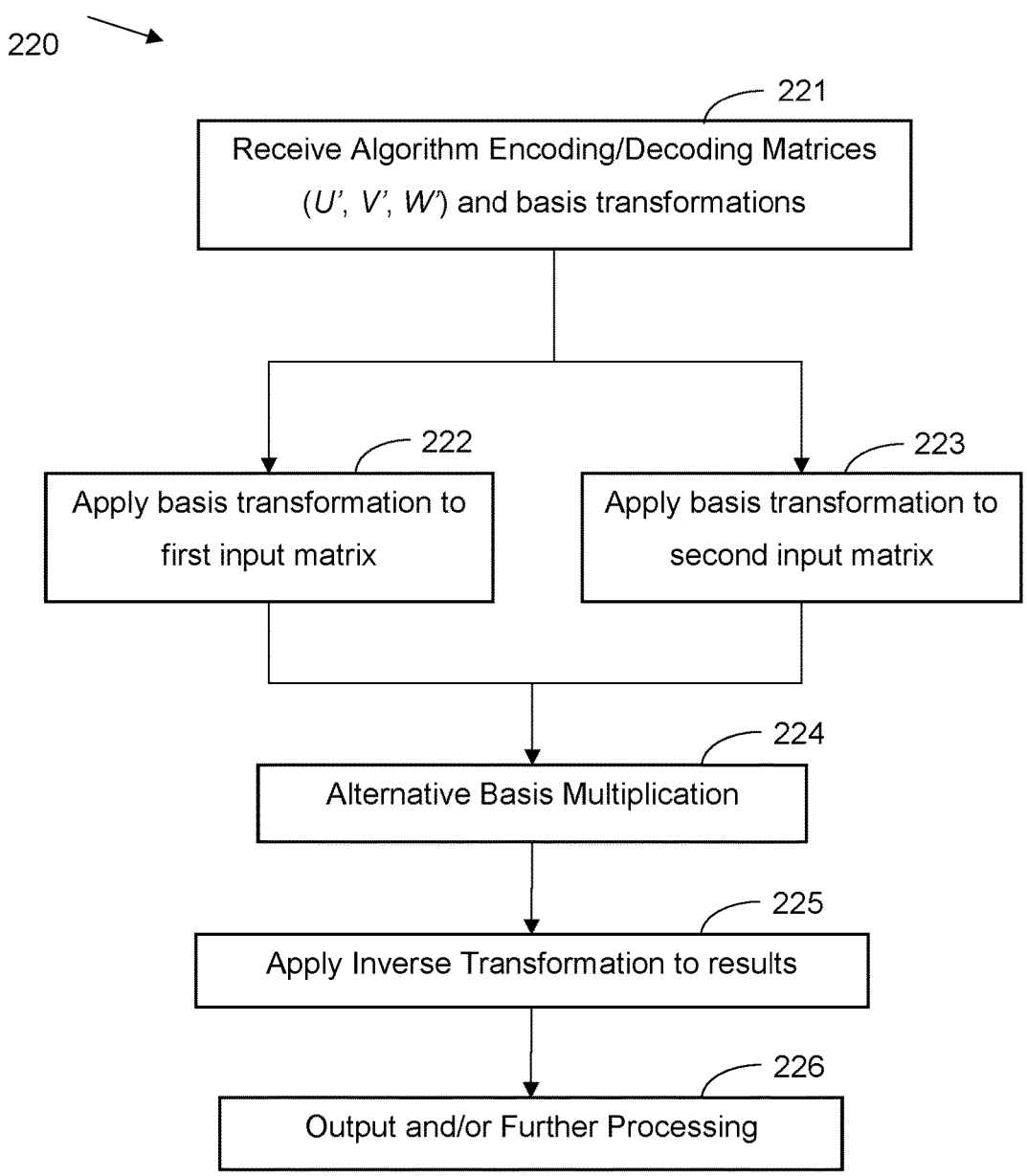
FIG. 2C shows a flowchart of a second method for matrix multiplication using an alternative basis transform.

Reference is now made to FIG. 2C, which shows a flowchart of a second method 220 for matrix multiplication using an alternative basis transform. Encoding/decoding matrices and alternative basis transformations are received 221. Basis transformations are applied 222 and 223 to the first and second input matrices. Matrix multiplication 224 is performed using the algorithm and encoding/decoding matrices, and the inverse transformation is applied 225 to the multiplication results. The inverse transformed results are outputted and/or further processed 226.

Presented herein are the Alternative Basis Matrix Multiplication techniques, which are applied to existing Strassen-like matrix multiplication algorithms. While basis transformations may be as computationally expensive as matrix multiplications, some may be performed very fast (e.g., Hadamard in $O(n^2 \log n)$ using FFT). Fortunately, so is the case for the basis transformation presented herein. Thus, it is a worthwhile trade-off of reducing the leading coefficient in exchange for an asymptotically insignificant overhead. Provided herein are analysis of how these constants are affected and the impact on both arithmetic and input-output (IO) complexity, such as communication costs.

The problem of finding alternative bases to improve Strassen-like algorithms, and present several improved variants of existing algorithms, are also disclosed and evaluated herein. For example, the alternative basis variant of Strassen's ⟨2,2,2; 7⟩-algorithm reduces the number of additions from 15 to 12, and the variant of Smirnov's ⟨6,3,3; 40⟩-algorithm with reduces the leading coefficient by about 83.2%.

Probert's lower bound theorem states that 15 additions are necessary for any ⟨2,2,2; 7⟩-algorithm. The result presented herein seemingly contradict Probert's lower bound. However, his bound implicitly assumes that the input and output are represented in the standard basis, thus there is not a contradiction. We extend Probert's lower bound to account for alternative bases.

In a basis invariant lower bound, 12 additions are necessary for any matrix multiplication algorithm that uses a recursive-bilinear algorithm with a 2×2 base case with 7 multiplications, regardless of basis (THEOREM 12 below). The alternative basis variant of Strassen's algorithm performs 12 additions in the base case, matching the lower bound according to Probert.

Following is a discussion of the communication bottleneck in matrix multiplication. Fast matrix multiplication algorithms have lower IO-complexity than the classical algorithm. That is, they communicate asymptotically less data within the memory hierarchy and between processors. The IO-complexity when measured as a function of the number of processors P, the local memory size M, and the matrix dimension n. Namely, the communication costs of a parallel $\langle n_0, n_0, n_0; t \rangle$-algorithm may be $$\Theta\left(\left(\frac{n}{\sqrt{M}}\right)^{\log_{n_0} t} \frac{M}{P}\right).$$

Thus, parallel versions of Strassen's algorithm which minimize communication cost outperform classical matrix multiplication in practice, both in shared-memory and distributed-memory architectures.

The alternative basis transformation $\langle 2,2,2; 7 \rangle$-algorithm may reduce the arithmetic complexity by 16.66% and may also reduce the IO-complexity by 20%, compared to Strassen-Winograd's algorithm. Hence, performance gain should be in range of 16-20% on a shared-memory machine.

In comparison to the other methods, Bodrato used the intermediate representation method, but only for repeated squaring and for chain matrix multiplication computations. The Bodrato method may apply only to the 2×2 matrix multiplication case. Thus, Bodrato obtained an algorithm with similar results to the 2×2 algorithm, however, the Bodrato algorithm was developed for chain multiplication and for repeated squaring, such as for every multiplication outside the first one. Furthermore, Bodrato algorithm refers only to a specific 2×2 matrix multiplication algorithm.

The technique presented herein may also be applied for repeated matrix multiplications (e.g., chain multiplication and repeated squaring), but also to even a single matrix multiplication computation. Furthermore, the technique presented herein may be applied to any matrix multiplication algorithm, regardless base case sizes, whereas Bodrato's algorithm is tailored for a specific algorithm of a given base case size.

Encoding and decoding matrices, such as using the basis transformation and the inverted basis transformation with a matrix multiplication algorithm, may be determined according to the following:

REMARK 1:
Let R be a ring, and let f: $R^n \times R^m \to R^k$ be a bilinear function which performs t multiplications. There exist $U \in R^{t \times n}$, $V \in R^{t \times m}$, $W \in R^{t \times k}$ such that $$\forall x \in R^n, y \in R^m f(x,y) = W^T((U \cdot x)e(V \cdot y))$$

where e is element-wise vector product (Hadamard product).

DEFINITION 1:
One may refer to the $\langle U, V, W \rangle$ of a recursive-bilinear algorithm as its encoding/decoding matrices (where U, V are the encoding matrices and W is the decoding matrix).

DEFINITION 2:
Let R denote a ring, such as an algebraic structure ring, and let $A \in R^{n \times m}$ denote a matrix. One may denote the vectorization of A by $\vec{A}$. One may use the notation $U_{l,(i,j)}$ when referring to the element in the l'th row on the column corresponding with the index (i,j) in the vectorization of A. For ease of notation, we sometimes write $A_{i,j}$ rather than $\vec{A}_{(i,j)}$.

As used herein, basis transformations and encoding/decoding matrices assume row-ordered vectorization of matrices.

REMARK 2: (Triple product condition).
Let R be a ring, and let $U \in R^{t \times n \cdot m}$, $V \in R^{t \times m \cdot k}$, $W \in R^{t \times n \cdot k}$. $\langle U, V, W \rangle$ are encoding/decoding matrices of an $\langle n, m, k; t \rangle$-algorithm if and only if:

$$\forall i_1, i_2 \in [n], k_1, k_2 \in [m], j_1, j_2 \in [k]$$

$$\sum_{r=1}^{t} U_{r,(i_1,k_1)} V_{r,(k_2,j_1)} W_{r,(i_2,j_2)} = \delta_{i_1,i_2} \delta_{k_1,k_2} \delta_{j_1,j_2}$$

where $\delta_{i,j}=1$ if i=j and 0 otherwise.

Denote the number of nonzero entries in a matrix by nnz(A), and the number of rows/columns by rows(A), cols(A).

REMARK 3:
The number of linear operations used by a bilinear algorithm is determined by its encoding/decoding matrices. The number of additions performed by each of the transformations is denoted:

Additions$U$=$nnz(U)$-rows($U$)

Additions$V$=$nnz(V)$-rows($V$)

The number of additions performed by the inverse-transformation is denoted:

Additions$W$=$nnz(W)$-cols($W$)

The number of scalar multiplication performed by each of the transformations is equal to the total number of matrix entries which are not 1, -1, and 0.

Following are details of matrix multiplication with alternative basis transformations. Fast matrix multiplication algorithms may be bilinear computations. The number of operations performed in the linear phases of bilinear algorithms (i.e. the application of their encoding/decoding matrices $\langle U, V, W \rangle$ in the case of matrix multiplication, see DEFINITION 1) depends on the basis of representation. Following are details of how alternative basis algorithms work (i.e. using basis transformations) and details of the effects of using alternative bases on arithmetic complexity and IO-complexity.

DEFINITION 3:
Let R be a ring and let $\phi$, $\psi$, $\upsilon$ be automorphisms of $R^{n \cdot m}$, $R^{m \cdot k}$, $R^{n \cdot k}$ (respectively). A Strassen-like algorithm which takes $\phi(A)$, $\psi(B)$ as inputs and outputs $\upsilon(A \cdot B)$ using t multiplications may be denoted as an $\langle n, m, k; t \rangle_{\phi,\psi,\upsilon}$-algorithm. If n=m=k and $\phi=\psi=\upsilon$, the notation used may be an $\langle n, n, n; t \rangle_\phi$-algorithm. This notation extends the $\langle n, m, k; t \rangle$-algorithm notation as the latter applies when the three basis transformations are the identity map.

Given a recursive-bilinear, $\langle n, m, k; t \rangle_{\phi,\psi,\upsilon}$-algorithm, denoted ALG, alternative basis matrix multiplication may be:

ALGORITHM 1:
Alternative Basis Matrix Multiplication Algorithm
INPUT: $A \in R^{n \times m}$, $B^{m \times k}$
OUTPUT: n×k matrix C=A·B
1: function ABS(A, B)
2: $\tilde{A}=\phi(A)//R^{n \times m}$ basis transformation
3: $\tilde{B}=\psi(B)//R^{m \times k}$ basis transformation 4: $\tilde{C}=ALG(\tilde{A}, \tilde{B})\langle n, m, k; t\rangle_{\phi,\psi,\upsilon}$-algorithm
5: $C=\upsilon^{-1}(\tilde{C})R^{n\times k}$ basis transformation C

LEMMA 1:

Let R be a ring, let $\langle U, V, W\rangle$ be the encoding/decoding matrices of an $\langle n, m, k; t\rangle$-algorithm, and let $\phi$, $\psi$, $\upsilon$ be automorphisms of $R^{n\cdot m}$, $R^{m\cdot k}$, $R^{n\cdot k}$ (respectively). $\langle U\phi^{-1}, V\psi^{-1}, W\upsilon^T\rangle$ are encoding/decoding matrices of an $\langle n, m, k; t\rangle_{\phi,\psi,\upsilon}$-algorithm.

Proof: $\langle U, V, W\rangle$ are encoding/decoding matrices of an $\langle n, m, k; t\rangle$-algorithm. Hence, for any $A\in R^{n\times m}$, $B\in R^{m\times k}$:

$$W^T((U\cdot A)e(V\cdot \vec{B})) = A\cdot B$$

Hence, $$\upsilon(A\cdot B) = \upsilon(W^T(U\cdot AeV\cdot B)) = (W\upsilon^T)^T(U\phi^{-1}\cdot \phi(A)eV\psi^{-1}\cdot \psi(B))$$

END Proof.

COROLLARY 1:

Let R be a ring, and let $\phi$, $\psi$, $\upsilon$ be automorphisms of $R^{n\cdot m}$, $R^{n\cdot k}$, $R^{n\cdot k}$ (respectively). $\langle U, V, W\rangle$ are encoding/decoding matrices of an $\langle n, m, k; t\rangle_{\phi,\psi,\upsilon}$-algorithm if and only if $\langle U\phi, V_\psi, W_\upsilon^{-T}\rangle$ are encoding/decoding matrices of an $\langle n, m, k; t\rangle$-algorithm.

Following are details of fast basis transformations:

DEFINITION 4:

Let R be a ring and let $\psi_1$: $R^{n_0\times m_0}\to R^{n_0\times m_0}$ be a linear map. We recursively define a linear map $\psi_{k+1}$: $R^{n\times m}\to R^{n\times m}$ (where $n=n_0^{l_1}$, $m=m_0^{l_2}$ for some $l_1$, $l_2\leq k+1$) by $(\psi_{k+1}(A))_{i,j}=\psi_k(\psi_1(A))_{i,j}$, where $A_{i,j}$ are $$\frac{n}{n_0}\times \frac{m}{m_0}$$

sub-matrices.

Note that $\psi_{k+1}$ is a linear map. For convenience, we omit the subscript of $\psi$ when obvious from context.

THEOREM 1:

Let R be a ring, let $\psi_1$: $R^{n_0\times m_0}\to R^{n_0\times m_0}$ be a linear map, and let $A\in R^{n\times m}$ (where $n=n_0^{k+1}$, $m=m_0^{k+1}$). Define $\tilde{A}$ by $(\tilde{A})_{i,j}=\psi_k(A_{i,j})$. Then $\psi_1(\tilde{A})=\psi_{k+1}(A)$.

Proof. $\psi_1$ is a linear map. Hence, for any $i\in[n_0]$, $j\in[m_0]$, $(\psi_1(A))_{i,j}$ is a linear sum of elements of A. Therefore, there exist scalars $$\{x_{r,\ell}^{(i,j)}\}_{r\in[n_0],\ell\in[m_0]}$$

such that $$(\psi_{k+1}(A))_{i,j} = \psi_k(\psi_1(A))_{i,j} = \psi_k\left(\sum_{r,\ell} x_{r,\ell}^{(i,j)}\cdot A_{r,\ell}\right)$$

By linearily of $\psi_k$: $=\sum_{r,\ell} x_{r,\ell}^{(i,j)}\psi_k(A_{r,\ell}) = (\psi_1(\tilde{A}))_{i,j}$ END Proof.

THEOREM 2:

Let R be a ring, let $\psi_1$: $R^{n_0\times m_0}\to R^{n_0\times m_0}$ be an invertible linear map, and let $\psi_{k+1}$ as defined above. $\psi_{k+1}$ is invertible and its inverse is $(\psi_{k+1}^{-1}(A))_{i,j}=\psi_k^{-1}(\psi_1^{-1}(A))_{i,j}$.

Proof. Define $\tilde{A}$ by $(\tilde{A})_{i,j}=\psi_k(A_{i,j})$ and define $\psi_{k+1}^{-1}$ by $(\psi_{k+1}^{-1}(A))_{i,j}=\psi_k^{-1}(\psi_1^{-1}(A))_{i,j}$. Then:

$$(\psi_{k+1}^{-1}(\psi_{k+1}(A)))_{i,j} = \psi_k^{-1}(\psi_1^{-1}(\psi_{k+1}(A)))_{i,j}$$

By THEOREM 1:

$$= \psi_k^{-1}(\psi_1^{-1}(\psi_1(\tilde{A})))_{i,j} = \psi_k^{-1}(\tilde{A})_{i,j}$$

By definition of $\tilde{A}$ $$= \psi_k^{-1}(\psi_k(A)_{i,j}) = A_{i,j}$$

END Proof.

Next, the arithmetic complexity and IO-complexity of fast basis transformations are analyzed. For convenience and readability, the square case is presented here. The analysis for rectangular matrices is similar.

THEOREM 3:

Let R be a ring, let $\psi_1$: $R^{n_0\times n_0}\to R^{n_0\times n_0}$ be a linear map, and let $A\in R^{n\times n}$ where $n=n_0^k$. The arithmetic complexity of computing $\psi(A)$ is $$F_\psi(n) = \frac{q}{n_0^2}n^2\log_{n_0} n$$

where q is the number of linear operations performed by $\psi_1$.

Proof. Let $F_\psi(n)$ be the number of additions required by $\psi$. Each step of the recursion consists of computing $n_0^2$ sub-problems and performs q additions of sub-matrices. Therefore, $$F_\psi(n) = n_0^2 F_\psi\left(\frac{n}{n_0}\right) + q\left(\frac{n^2}{n_0}\right) \text{ and } F_\psi(1) = 0.$$

Thus, $$F_\psi(n) = n_0^2 F_\psi\left(\frac{n}{n_0}\right) + q\left(\frac{n}{n_0}\right)^2 = \sum_{k=0}^{\log_{n_0}(n)-1}(n_0^2)^k\left(q\left(\frac{n}{n_0^{k+1}}\right)^2\right) = \frac{q}{n_0^2}n^2 \cdot \sum_{k=0}^{\log_{n_0}(n)-1}\left(\frac{n_0^2}{n_0^2}\right)^k = \frac{q}{n_0^2}n^2\cdot \log_{n_0}(n)$$

END Proof.

THEOREM 4:

Let R be a ring and let $\psi_1$: $R^{n_0\times n_0}\to R^{n_0\times n_0}$ be a linear map, and let $A\in R^{n\times n}$ where $n=n_0^k$. The IO-complexity of computing $\psi(A)$ is $$IO_\psi(n, M) \leq \frac{3q}{n_0^2}n^2\log_{n_0}\left(\sqrt{2}\,\frac{n}{\sqrt{M}}\right) + 2M$$

where q is the number of linear operations performed by $\psi_1$.

Proof. Each step of the recursion consists of computing $n_0^2$ sub-problems and performs q linear operations. The base case occurs when the problem fits entirely in the fast memory (or local memory in parallel setting), namely $2n^2 \leq M$. Each addition requires at most 3 data transfers (one of each input and one for writing the output). Hence, a basis transformation which performs q linear operations at each recursive steps has the recurrence:

$$IO_\psi(n, M) \leq \begin{cases} n_0^2 IO_\psi\left(\frac{n}{n_0}, M\right) + 3q \cdot \left(\frac{n}{n_0}\right)^2 & 2n^2 > M \\ 2M & \text{otherwise} \end{cases}$$

Therefore $$IO_\psi(n, M) \leq n_0^2 IO_\psi\left(\frac{n}{n_0}, M\right) + 3q\left(\frac{n}{n_0}\right)^2 =$$

$$\sum_{k=0}^{\log_{n_0}\left(\frac{n}{\sqrt{M/2}}\right)-1} (n_0^2)^k \left(3q\left(\frac{n}{n_0^{k+1}}\right)^2\right) + 2M =$$

$$\frac{3q}{n_0^2} n^2 \cdot \sum_{k=0}^{\log_{n_0}\left(\sqrt{2} \cdot \frac{n}{\sqrt{M}}\right)-1} \left(\frac{n_0^2}{n_0^2}\right)^k + 2M =$$

$$\frac{3q}{n_0^2} n^2 \cdot \log_{n_0}\left(\sqrt{2} \cdot \frac{n}{\sqrt{M}}\right) + 2M$$

END Proof.

Following are details of computing matrix multiplication in an alternative basis.

THEOREM 5:

Let $\phi_1$, $\psi_1$, $\upsilon_1$ be automorphisms of $R^{n_0 \times m_0}$, $R^{m_0 \times k_0}$, $R^{n_0 \times k_0}$ (respectively), and let ALG be an $\langle n_0, m_0, k_0; t\rangle_{\phi_1,\psi_1,\upsilon_1}$ algorithm. For any $A \in R^{n \times m}$, $B \in R^{m \times k}$:

$$ALG(\phi_l(A), \psi_l(B)) = \upsilon_l(A \cdot B)$$

where $n = n_0^l$, $m = m_0^l$, $k = k_0^l$.

Proof. Denote $\tilde{C} = ALG(\phi_{l+1}(A), \psi_{l+1}(B))$ and the encoding/decoding matrices of ALG by $\langle U, V, W \rangle$. We prove by induction on l that $\tilde{C} = \upsilon_l(A \cdot B)$. For $r \in [t]$, denote $$S_r = \sum_{i \in [n_0], j \in [m_0]} U_{r,(i,j)}(\phi_1(A))_{i,j}$$

$$T_r = \sum_{i \in [m_0], j \in [k_0]} V_{r,(i,j)}(\psi_1(B))_{i,j}$$

The base case, $l=1$, holds by LEMMA 1 since ALG is an $\langle n_0, m_0, k_0; t\rangle_{\phi_1,\psi_1,\upsilon_1}$-algorithm. Note that this means that for any $i \in [n_0]$, $j \in [k_0]$ $$(\upsilon_1(AB))_{i,j} = (W^T((U \cdot \phi_1(A))e(V \cdot \psi_1(B))))_{i,j}$$

$$= \sum_{r \in [t]} W_{r,(i,j)}(S_r \cdot T_r)$$

It is assumed the theorem holds for $l \in \mathbb{N}$ and also for $l+1$. Given input $\tilde{A} = \phi_{l+1}(A)$, $\tilde{B} = \psi_{l+1}(B)$, ALG performs t multiplications $P_1, \ldots, P_t$. For each multiplication $P_r$, its left-hand side multiplicand is of the form:

$$L_r = \sum_{i \in [n_0], j \in [m_0]} U_{r,(i,j)} \tilde{A}_{i,j}$$

By DEFINITION 4, $(\phi_{l+1}(A))_{i,j} = \phi_l(\phi_1(A))_{i,j}$. Hence, $$= \sum_{i \in [n_0], j \in [m_0]} U_{r,(i,j)}(\phi_l(\phi_1(A))_{i,j})$$

From linearity of $\phi_l$ $$= \phi_l\left(\sum_{i \in [n_0], j \in [m_0]} U_{r,(i,j)}(\phi_l(\phi_1(A))_{i,j})\right)$$

$$= \phi_l(S_r)$$

And similarly, the right-hand multiplication $R_r$ is of the form $$R_r = \psi_l(T_r).$$

Note that for any $r \in [t]$, $S_r$, $T_r$ are $n_0^l \times m_0^l$ and $m_0^l \times k_0^l$ matrices, respectively. Hence, by the induction hypothesis, $$P_r = ALG(\phi_l(S_r), \psi_l(T_r)) = \upsilon_l(S_r \cdot T_r).$$

Each entry in the output $\tilde{C}$ is of the form:

$$\tilde{C}_{i,j} = \sum_{r \in [t]} W_{r,(i,j)} P_r$$

$$= \sum_{r \in [t]} W_{r,(i,j)} \upsilon_l(S_r \cdot T_r)$$

By linearity of $\upsilon_l$ $$= \upsilon_l\left(\sum_{r \in [t]} W_{r,(i,j)}(S_r \cdot T_r)\right)$$

And, as noted in the base case:

$$(\upsilon_1(A \cdot B))_{i,j} = \left(\sum_{r \in [t]} W_{r,(i,j)}(S_r \cdot T_r)\right)_{(i,j)}$$

Hence, $$\tilde{C}_{i,j} = \upsilon_l(\upsilon_1(A \cdot B))_{i,j}$$

Therefore, by DEFINITION 4, $\tilde{C} = \upsilon_{l+1}(A \cdot B)$.

End Proof.

When discussing an $\langle n_0, n_0, n_0; t\rangle_{\phi,\psi,\upsilon}$-algorithm, we denote $\omega_0 = \log_{n_0} t$.

THEOREM 6:

Let ALG be an $\langle n_0, n_0, n_0; t\rangle_{\phi,\psi,\upsilon}$-algorithm which performs q linear operations at its base case. The arithmetic complexity of ALG is $$F_{ALG}(n) = \left(1 + \frac{q}{t - n_0^2}\right) n^{\omega_0} - \left(\frac{q}{t - n_0^2}\right) n^2$$

Proof. Each step of the recursion consists of computing t sub-problems and performs q linear operations (additions/multiplication by scalar) of sub-matrices. Therefore $$F_{ALG}(n) = tF_\psi\left(\frac{n}{n_0}\right) + q\left(\frac{n}{n^0}\right)^2 \text{ and } F_{ALG}(1) = 1.$$

Thus, $$F_{ALG}(n) = \sum_{k=0}^{\log_{n_0} n - 1} t^k \cdot q \cdot \left(\frac{n}{n_0^{k+1}}\right)^2 + t^{\log_{n_0} n} \cdot F_{ALG}(1)$$

$$= \frac{q}{n_0^2} n^2 \cdot \sum_{k=0}^{\log_{n_0} n - 1} \left(\frac{t}{n_0^2}\right)^k + n^{\omega_0}$$

$$= \frac{q}{n_0^2} n^2 \left(\frac{\left(\frac{t}{n_0^2}\right)^{\log_{n_0} n} - 1}{\frac{t}{n_0^2} - 1}\right) + n^{\omega_0} q\left(\frac{n^{\omega_0} - n^2}{t - n_0^2}\right) + n^{\omega_0}$$

END Proof.

THEOREM 7:

Let ALG be an $\langle n_0, n_0, n_0; t\rangle_{\phi,\psi,\upsilon}$-algorithm which performs q linear operations at its base case. The IO-complexity of ALG is $$IO_{ALG}(n, M) \le \left(\frac{q}{t - n_0^2}\right)\left(M\left(\sqrt{3} \cdot \frac{n}{\sqrt{M}}\right)^{\omega_0} - 3n^2\right) + 3M$$

Proof. Each step of the recursion consists of computing $n_0^2$ sub-problems and performs q linear operations. The base case occurs when the problem fits entirely in the fast memory (or local memory in parallel setting), namely $3n^2 \le M$. Each addition requires at most 3 data transfers (one of each input and one for writing the output). Hence, a basis transformation which performs q linear operations at each recursive steps has the recurrence:

$$IO_{ALG}(n, M) \le \begin{cases} t \cdot IO_\psi\left(\frac{n}{n_0}, M\right) + 3q \cdot \left(\frac{n}{n_0}\right)^2 & 3n^2 > M \\ 3M & \text{otherwise} \end{cases}$$

Therefore $$IO_{ALG}(n, M) \le \sum_{k=0}^{\log_{n_0} \frac{n}{\sqrt{M/3}} - 1} t^k \cdot 3q\left(\frac{n}{n_0^{k+1}}\right)^2 + 3M =$$

$$\frac{3q}{n_0^2} n^2 \sum_{k=0}^{\log_{n_0} \frac{n}{\sqrt{M/3}} - 1} \left(\frac{t}{n_0^2}\right)^k + 3M = \frac{3q}{n_0^2} n^2 \left(\frac{\left(\frac{t}{n_0^2}\right)^{\log_{n_0} \frac{n}{\sqrt{M/3}}} - 1}{\frac{t}{n_0^2} - 1}\right) + 3M =$$

$$q\left(\frac{M\left(\sqrt{3} \cdot \frac{n}{\sqrt{M}}\right)^{\omega_0} - 3n^2}{t - n_0^2}\right) + 3M$$

END Proof.

COROLLARY 2:

When ABS (ALGORITHM 1) performs q linear operations at the base case, then its arithmetic complexity is $$F_{ABS}(n) = \left(1 + \frac{q}{t - n_0^2}\right) n^{\omega_0} - \left(\frac{q}{t - n_0^2}\right) n^2 + O(n^2 \log n)$$

Proof. The number of flops performed by the algorithm is the sum of: (1) the number of flops performed by the basis transformations (denoted $\phi$, $\psi$, $\upsilon$) and (2) the number of flops performed by the recursive bilinear algorithms ALG.

$$F_{ABS}(n) = F_{ALG}(n) + F_\phi(n) + F_\psi(n) + F_\upsilon(n)$$

The result immediately follows from THEOREM 3 and THEOREM 6.

END Proof.

COROLLARY 3:

When ABS (ALGORITHM 1) performs q linear operations at the base case, then its IO-complexity is $$IO_{ALG}(n, M) \le \left(\frac{3q}{t - n_0^2}\right)\left(M\left(\frac{\sqrt{3} \cdot n}{\sqrt{M}}\right)^{\omega_0} - n^2\right) + 3M + O\left(n^2 \log \frac{n}{\sqrt{M}}\right)$$

Proof. The IO-complexity is the sum of: (1) the IO-complexity of the recursive bilinear algorithms ALG and (2) the IO-complexity of the basis transformations (denoted $\phi$, $\psi$, $\upsilon$).

$$IO_{ABS}(n,M) = IO_{ALG}(n,M) + IO_\phi(n,M) + IO_\psi(n,M) + IO_\upsilon(n,M)$$

The result immediately follows from THEOREM 4 and THEOREM 7.

END Proof.

Following is an example of an alternative basis transformation for a $\langle 2, 2, 2; 7\rangle$-algorithm. A basis transformation $\psi_{opt}: R^4 \to R^4$ and an $\langle 2,2,2; 7\rangle_\psi$-algorithm are disclosed which perform only 12 linear operations. Let, $\psi_{opt}$ refer to the following transformation:

$$\psi_{opt} = \begin{pmatrix} 1 & 0 & 0 & 0 \\ 0 & 1 & -1 & 1 \\ 0 & 0 & -1 & 1 \\ 0 & 1 & 0 & 1 \end{pmatrix} \quad \psi_{opt}^{-1} = \begin{pmatrix} 1 & 0 & 0 & 0 \\ 0 & 1 & -1 & 0 \\ 0 & -1 & 0 & 1 \\ 0 & -1 & 1 & 1 \end{pmatrix}$$

For convenience, when applying $\psi$ to matrices, we omit the vectorization and refer to it as $\psi: R^{2\times 2} \to R^{2\times 2}$:

$$\psi_{opt}(A) = \psi_1\begin{pmatrix} A_{1,1} & A_{1,2} \\ A_{2,1} & A_{2,2} \end{pmatrix} = \begin{pmatrix} A_{1,1} & A_{1,2} - A_{2,1} + A_{2,2} \\ A_{21} - A_{2,2} & A_{1,2} + A_{2,2} \end{pmatrix}$$

where $A_{i,j}$ can be ring elements or sub-matrices. $\psi_{opt}^{-1}$ is defined analogously. Both $\psi_{opt}$ and $\psi_{opt}^{-1}$ extend recursively as in DEFINITION 4. Thus: $\langle U, V, W \rangle$ are the encoding/decoding matrices of our $\langle 2,2,2; 7 \rangle_{\psi_{opt}}$-algorithm which performs 12 linear operations:

$$\langle U_{opt}, V_{opt}, W_{opt} \rangle = \left\langle \begin{pmatrix} 0 & 0 & 0 & 1 \\ 0 & 0 & 1 & 0 \\ 0 & 1 & 0 & 0 \\ 1 & 0 & 0 & 0 \\ 0 & 1 & -1 & 0 \\ -1 & 1 & 0 & 0 \\ 0 & -1 & 0 & 1 \end{pmatrix}, \begin{pmatrix} 0 & 0 & 0 & 1 \\ 0 & 0 & 1 & 0 \\ 0 & 1 & 0 & 0 \\ 1 & 0 & 0 & 0 \\ 0 & -1 & 0 & 1 \\ 0 & 1 & -1 & 0 \\ -1 & 1 & 0 & 0 \end{pmatrix}, \begin{pmatrix} 0 & 0 & 0 & 1 \\ 0 & 0 & 1 & 0 \\ 0 & 1 & 0 & 0 \\ 1 & 0 & 0 & 0 \\ 1 & 1 & 0 & 0 \\ 0 & -1 & 0 & -1 \\ 0 & 1 & 1 & 0 \end{pmatrix} \right\rangle$$

THEOREM 8:
$\langle U_{opt}, V_{opt}, W_{opt} \rangle$ are encoding/decoding matrices of an $\langle 2,2,2; 7 \rangle_{\psi_{opt}}$-algorithm.
  Proof. Observe that $$\langle U_{opt} \cdot \psi_{opt}, V_{opt} \cdot \psi_{opt}, W_{opt} \cdot \psi_{opt}^{-T} \rangle = \left\langle \begin{pmatrix} 0 & 1 & 0 & 1 \\ 0 & 0 & -1 & 1 \\ 0 & 1 & -1 & 1 \\ 1 & 0 & 0 & 0 \\ 0 & 1 & 0 & 0 \\ -1 & 1 & -1 & 1 \\ 0 & 0 & 1 & 0 \end{pmatrix}, \begin{pmatrix} 0 & 1 & 0 & 1 \\ 0 & 0 & -1 & 1 \\ 0 & 1 & -1 & 1 \\ 1 & 0 & 0 & 0 \\ 0 & 0 & 1 & 0 \\ 0 & 1 & 0 & 0 \\ -1 & 1 & -1 & 1 \end{pmatrix}, \begin{pmatrix} 0 & 0 & 1 & 1 \\ 0 & -1 & 0 & 1 \\ 0 & 1 & -1 & -1 \\ 1 & 0 & 0 & 0 \\ 1 & 1 & -1 & -1 \\ 0 & -1 & 0 & 0 \\ 0 & 0 & -1 & 0 \end{pmatrix} \right\rangle$$

It is easy to verify that $\langle U_{opt} \cdot \psi_{opt}, V_{opt} \cdot \psi_{opt}, W_{opt} \cdot \psi_{opt}^{-T} \rangle$ satisfy the triple product condition in REMARK 1. Hence, they are an encoding/decoding algorithm of an $\langle 2,2,2; 7 \rangle$-algorithm.
  END Proof.
  From COROLLARY 1, THEOREM 9 follows:
  THEOREM 9:
Let R be a ring, and let $A \in R^{n \times n}$ where $n=2^k$. The arithmetic complexity of computing $\psi_{opt}(A)$ is $$F_{\psi_{opt}}(n) = n^2 \log_2 n$$

The same holds for computing $\psi_{opt}^{-1}(A)$.
  Proof. Both $\psi_{opt}, \psi_{opt}^{-1}$ perform q=4 linear operations at each recursive step and has base case size of $n_0=2$. The lemma follows immediately from THEOREM 3.
  END Proof.
  THEOREM 10:
Let R be a ring, and let $A \in R^{n \times n}$ where $n=2^k$. The I/O-complexity of computing $\psi_{opt}(A)$ is $$IO_{\psi_{opt}}(n, M) \leq 2n^2 \log_2\left(\sqrt{2} \frac{n}{\sqrt{M}}\right) + 2M$$

Proof. Both $\psi_{opt}, \psi_{opt}^{-1}$ perform q=4 linear operations at each recursive step. The lemma follows immediately from THEOREM 4 with base case $n_0=2$.
  END Proof.
  COROLLARY 4:
Our $\langle 2,2,2; 7 \rangle_{\psi_{opt}}$-algorithm's arithmetic complexity is $F_{opt}(n) = 5n^{\log_2 7} - 4n^2$.
  Proof. Our $\langle 2,2,2; 7 \rangle_{\psi_{opt}}$-algorithm has a 2×2 base case and performs 7 multiplications. Applying REMARK 3 to its encoding/decoding matrices $\langle U_{opt}, V_{opt}, W_{opt} \rangle$, we see that it performs 12 linear operations. The result follows immediately from THEOREM 6.
  COROLLARY 5:
Our $\langle 2,2,2; 7 \rangle_{\psi_{opt}}$-algorithm's IO-complexity is $$IO_{opt}(n, M) \leq 12 \cdot \left( \sqrt{3} \cdot M \left( \frac{n}{\sqrt{M}} \right)^{\log_2 7} - 3n^2 \right) + 3M$$

Proof. Our algorithm has a 2×2 base case and performs 7 multiplications. By applying REMARK 3 to encoding/decoding matrices (as shown above), we see that 12 linear operations are performed. The result follows immediately from THEOREM 7.
  END Proof.
  COROLLARY 6:
The arithmetic complexity of ABS (ALGORITHM 1) with our $\langle 2,2,2; 7 \rangle_{\psi_{opt}}$-algorithm is $$F_{ABS}(n) = 5n^{\log_2 7} - 4n^2 + 3n^2 \log_2 n$$

Proof. The proof is similar to that of COROLLARY 2.
  END Proof.
  COROLLARY 7:
The IO-complexity of ABS (ALGORITHM 1) with our $\langle 2,2,2; 7 \rangle_{\psi_{opt}}$-algorithm is $$IO_{ALG}(n, M) \leq 4 \cdot \left( \frac{\sqrt{3} \cdot n}{\sqrt{M}} \right)^{\log_2 7} \cdot M - 12n^2 + 3n^2 \cdot \log_2\left(\sqrt{2} \cdot \frac{n}{\sqrt{M}}\right) + 5M$$

Proof. The proof is similar to that of COROLLARY 3.
  END Proof.
  THEOREM 11:
Our $\langle 2,2,2; 7 \rangle_{\psi_{opt}}$-algorithm's sequential and parallel IO-complexity is bound by $$\Omega\left( \left( \frac{n}{\sqrt{M}} \right)^{\omega_0} \frac{M}{P} \right)$$

(where P is the number of processors, 1 in the sequential case, and $\omega_0 = \log_2 7$).
  Proof. We refer to the undirected bipartite graph defined by the tranformed matrix of our a Strassen-like algorithm as its tranformed graph (i.e., the edge (i, j) exists if $W_{i,j} \neq 0$). Ballard et al. proved that for any square recursive-bilinear Strassen-like algorithm with $n_0 \times n_0$ base case which performs t multiplications, if the tranformed graph is connected then these bounds apply with $\omega_0 = \log_{n_0} t$. The tranformed graph of our algorithm is connected. Hence, the theorem is true.
  END Proof.
  Following is a basis-invariant lower bound on additions for 2×2 matrix multiplication. Here THEOREM 12 is proven which says that 12 additions are necessary to compute 2×2 matrix multiplication recursively with base case of 2×2 and 7 multiplications, irrespective of basis. THEOREM 12 completes Probert's lower bound which says that for standard basis, 15 additions are required. Denote the permutation matrix which swaps row-order for column-order of vectorization of an I×J matrix by $P_{I \times J}$.

LEMMA 2:

Let $\langle U, V, W \rangle$ be the encoding/decoding matrices of an $\langle m, k, n; t \rangle$-algorithm. Then $\langle WP_{n \times m}, U, VP_{n \times k} \rangle$ are encoding/decoding of an $\langle n, m, k; t \rangle$-algorithm.

We use the following proofs:

LEMMA 3:

When an algorithm for 2×2 matrix multiplication has k left (right) hand side multiplicands from the set $S=\{A_{1,1}, (A_{1,2}+A_{2,1}), (A_{1,1}+A_{1,2}+A_{2,1})\}$, where additions are done modulo 2, then it requires at least 6+k multiplications.

COROLLARY 8:

LEMMA 3 also applies for the following definitions of S:

1. $(A_{1,1}+A_{2,1}), (A_{1,2}+A_{2,1}+A_{2,2}), (A_{1,1}+A_{1,2}+A_{2,2})$
2. $(A_{1,1}+A_{1,2}), (A_{1,2}+A_{2,1}+A_{2,2}), (A_{u}+A_{2,1}+A_{2,2})$
3. $(A_{1,1}+A_{1,2}+A_{2,1}+A_{2,2}), (A_{1,2}+A_{2,1}), (A_{1,1}+A_{2,2})$
4. $A_{2,1}, (A_{1,1}+A_{2,2}), (A_{1,1}+A_{2,1}+A_{2,2})$
5. $(A_{2,1}+A_{2,2}), (A_{1,1}+A_{1,2}+A_{2,2}), (A_{1,1}+A_{1,2}+A_{2,1})$
6. $A_{1,2}, (A_{1,1}+A_{2,2}), (A_{1,1}+A_{1,2}+A_{2,2})$
7. $(A_{1,2}+A_{2,2}), (A_{1,1}+A_{2,1}+A_{2,2}), (A_{1,1}+A_{1,2}+A_{2,1})$
8. $A_{2,2}, (A_{1,2}+A_{2,1}), (A_{1,2}+A_{2,1}+A_{2,2})$

COROLLARY 9:

Any 2×2 matrix multiplication algorithm where a left hand (or right hand) multiplicand appears at least twice (modulo 2) requires 8 or more multiplications.

Proof. Immediate from LEMMA 3 and COROLLARY 8 since it covers all possible linear sums of matrix elements, modulo 2.

END Proof.

REMARK 4:

A simple counting argument shows that any 7×4 binary matrix with less than 10 non-zero entries has a duplicate row (modulo 2) or an all zero row.

LEMMA 4:

Irrespective of basis transformations $\phi, \psi, \upsilon$, the transformed matrices U, V, of an $\langle 2,2,2; 7 \rangle_{\phi,\psi,\upsilon}$-algorithm contain no duplicate rows.

Proof. Let $\langle U, V, W \rangle$ be encoding/decoding matrices of an $\langle 2,2,2; 7 \rangle_{\phi,\psi,\upsilon}$-algorithm. By COROLLARY 1, $\langle U\phi, V\psi, W\upsilon^{-T} \rangle$ are encoding/decoding matrices of a $\langle 2,2,2; 7 \rangle$-algorithm. Assume, w.l.o.g, that U contains a duplicate row, which means that $U\phi$ contains a duplicate row as well. In that case, $\langle U\psi, V\psi, W\upsilon^{-T} \rangle$ is a $\langle 2,2,2; 7 \rangle$-algorithm in which one of the transformed matrices contains a duplicate row, in contradiction to COROLLARY 9.

END Proof.

LEMMA 5:

Irrespective of basis transformations $\phi, \psi, \upsilon$, the transformed matrices U, V, of a $\langle 2,2,2; 7 \rangle_{\phi,\psi,\upsilon}$-algorithm have at least 10 non-zero entries.

Proof. No row in U, V can be zeroed out since otherwise the algorithm would require less than 7 multiplications. The result then follows from REMARK 4 and LEMMA 4.

END Proof.

LEMMA 6:

Irrespective of basis transformations $\phi, \psi, \upsilon$, the tranformed matrix W of an $\langle 2,2,2; 7 \rangle_{\phi,\psi,\upsilon}$-algorithm has at least 10 non-zero entries.

Proof. Let $\langle U, V, W \rangle$ be encoding/decoding matrices of an $\langle 2,2,2; 7 \rangle_{\phi,\psi,\upsilon}$-algorithm and suppose by contradiction that W has less than 10 non-zero entries. W is a 7×4 matrix. By REMARK 4, it either has a duplicate row (modulo 2) or an all zero row. Corollary 1 states that $\langle U\phi, V\psi, W\upsilon^{-T} \rangle$ are encoding/decoding matrices of a $\langle 2,2,2; 7 \rangle$-algorithm. By LEMMA 2, because $\langle U\phi, V\psi, W\upsilon^{-T} \rangle$ define a $\langle 2,2,2; 7 \rangle$-algorithm, so does $\langle W\upsilon^{-T} P_{2\times 2}, U\phi, V\psi P_{2\times 2} \rangle$. Hence $W\upsilon^{-T} P_{2\times 2}$ is an encoded matrix of a $\langle 2,2,2; 7 \rangle$-algorithm which has duplicate or all zero rows, contradicting COROLLARY 9.

END Proof.

THEOREM 12:

12 additions are necessary for any matrix multiplication algorithm that uses a recursive-bilinear algorithm with a 2×2 base case with 7 multiplications, regardless of basis.

Proof. LEMMA 5 and LEMMA 6 show that each encoding/decoding matrix must contain at least 10 non-zero entries. By REMARK 3, the number of additions used by each of the encoding matrix is nnz(U)−rows(U) (and analogously for V) and the number of additions used by the tranformed is nnz(W)−cols(W). Hence, 12 additions are necessary for an $\langle 2,2,2; 7 \rangle_{\phi,\psi,\upsilon}$-algorithm irrespective of basis transformations $\phi, \psi, \upsilon$.

END Proof.

Following are details on finding alternative bases for transformations. To apply our alternative basis method to other Strassen-like matrix multiplication algorithms, we find bases which reduce the number of linear operations performed by the bi-linear part of the algorithm. As we mentioned in REMARK 3, the non-zero entries of the encoding/decoding matrices determine the number of linear operations performed by an algorithm. Hence, we want our encoding/decoding matrices to be as sparse as possible, and ideally to have only entries of the form −1, 0 and 1. From LEMMA 1 and COROLLARY 1 we see that any $\langle n, m, k; t \rangle$-algorithm and dimension compatible basis transformations $\phi, \psi, \upsilon$ can be composed into an $\langle n, m, k; t \rangle_{\phi,\psi,\upsilon}$-algorithm. Therefore, the problem of finding a basis in which a Strassen-like algorithm performs the least amount of linear operations is closely tied to the Matrix Sparsification problem—let U be an m×n matrix of full rank, find an invertible matrix A such that:

$$A = \underset{A \in GL_n}{\mathrm{argmin}}(nnz(UA))$$

Finding basis transformations for a Strassen-like algorithm may consist of three independent MS problems. Unfortunately, MS is not only NP-Hard to solve, but also NP-Hard to approximate to within a factor of $2^{\log^{3-o(1)} n}$ (over $\mathbb{Q}$, assuming NP does not admit quasi-polynomial time deterministic algorithms). There seem to be very few heuristics for matrix sparsification, or algorithms under very limiting assumptions. Nevertheless, for existing Strassen-like algorithms with small base cases, the use of search heuristics to find bases which significantly sparsify the encoding/decoding matrices of several Strassen-like algorithms proved useful.

Methods for sparsification may include Gaussian Elimination, such as devised by Carl Friedrich Gauss in 1810. However, Isaac Newton wrote of a similar method and published this in *Arithmetica Universalis* in 1707. A sparsification algorithm which is specific to matrices representing planar graphs has been described by Gilbert et al. in Numer. Math. (1986) 50: 377, (https://doi.org/10.1007/BF01396660). Another algorithm to sparsify matrices is described by Chang et al. in Mathematical Programming (1992) 56: 1, (https://doi.org/10.1007/BF01580890).

Following are remarks on the implementation and practical considerations, such as using a recursion cutoff point. Implementations of fast matrix multiplication algorithms often take several recursive steps then call the classical algorithm from a vendor-tuned library. This gives better performance in practice due to two main reasons: (1) the asymptotic improvement of Strassen-like algorithms makes them faster than classical algorithms by margins which increase with matrix size, and (2) vendor-tuned libraries have extensive built-in optimization, which makes them perform better than existing implementations of fast matrix multiplication algorithms on small matrices.

Following is presented a theoretical analysis for finding the number of recursive steps without tuning.

THEOREM 13:

Let ALG be an $\langle n, n, n; t \rangle$-algorithm with q linear operations at the base case. The arithmetic complexity of running ALG for l steps, then switching to classical matrix multiplication is:

$$F_{ALG}(n, l) = \frac{q}{t - n_0^2}\left(\left(\frac{t}{n_0^2}\right)^l - 1\right) \cdot n^2 + t^l\left(2\left(\frac{n}{n_0^l}\right)^3 - \left(\frac{n}{n_0^l}\right)^2\right)$$

Proof. Each step of the recursion consists of computing t sub-problems and performs q linear operations. Therefore, $$F_{ALG}(n, l) = t \cdot F_{ALG}\left(\frac{n}{n_0}, l - 1\right) + q\left(\frac{n}{n_0}\right)^2$$

and $F_{ALG}(n, 0) = 2n^3 - n^2$. Thus $$F_{ALG}(n, l) = \sum_{k=0}^{l-1} t^k \cdot q \cdot \left(\frac{n}{n_0^{k+1}}\right)^2 + t^l \cdot F_{ALG}\left(\frac{n}{n_0^l}\right) =$$

$$\frac{q}{n_0^2}n^2\left(\frac{\left(\frac{t}{n_0^2}\right)^l - 1}{\frac{t}{n_0^2} - 1}\right) + t^l\left(2\left(\frac{n}{n_0^l}\right)^3 - \left(\frac{n}{n_0^l}\right)^2\right) =$$

$$\frac{q}{t - n_0^2}\left(\left(\frac{t}{n_0^2}\right)^l - 1\right) \cdot n^2 + t^l\left(2\left(\frac{n}{n_0^l}\right)^3 - \left(\frac{n}{n_0^l}\right)^2\right)$$

END Proof.

When running an alternative basis algorithm for a limited number of recursive steps, the basis transformation needs to be computed only for the same number of recursive steps. If the basis transformation is computed for more steps than the alternative basis multiplication, the classical algorithm will compute incorrect results as it does not account for the input being represented in an alternative basis. This introduces a small saving in the runtime of basis transformation.

THEOREM 14:

Let R be a ring and let $\psi_1: R^{n_0 \times n_0} \to R^{n_0 \times n_0}$ be an invertible linear map, let $A \in R^{n \times n}$ where $n = n_0^k$, and let $1 \leq k$. The arithmetic complexity of computing $\psi_l(A)$ is $$F_\psi(n, l) = \frac{q}{n_0^2}n^2 \cdot l$$

Proof. Let $F_{\psi_l}(n)$ be the number of additions required by $\psi_l$. Each recursive consists of computing $n_0^2$ sub-problems and performing q linear operations. Therefore, $$F_\psi(n, l) = n_0^2 \cdot F_\psi\left(\frac{n}{n_0}, l - 1\right) + q \cdot \left(\frac{n}{n_0}\right)^2 \text{ and } F_\psi(n, 0) = 0$$

$$F_{\psi_l}(n) = \sum_{k=0}^{l-1} (n_0^2)^k \cdot q\left(\frac{n}{n_0^{k+1}}\right)^2 = \frac{q}{n_0^2}n^2 \cdot \sum_{k=0}^{l-1}\left(\frac{n_0^2}{n_0^2}\right)^k = \frac{q}{n_0^2}n^2 \cdot l$$

END Proof.

Other alternative basis transformations for Strassen's <2,2,2;7>-algorithm include those in TABLE 1A and TABLE 1B.

TABLE 1A

Second Alternative Bases for Strassen's <2, 2, 2; 7>-algorithm.

| phi | | | | psi | | | | upsilon | | | |
|---|---|---|---|---|---|---|---|---|---|---|---|
| 0 | −1 | 0 | 0 | 1 | 0 | 0 | 0 | −1 | 0 | 0 | 0 |
| 1 | 0 | 1 | 0 | 0 | −1 | 0 | 1 | 1 | 1 | 1 | 1 |
| 0 | −1 | 1 | 0 | −1 | 0 | 1 | 0 | −1 | 0 | −1 | −1 |
| 0 | 0 | −1 | −1 | −1 | 0 | 0 | −1 | 0 | 0 | 0 | −1 |

| U | | | | V | | | | W | | | |
|---|---|---|---|---|---|---|---|---|---|---|---|
| 0 | 1 | −1 | 0 | 1 | 0 | 0 | 0 | −1 | 0 | −1 | 0 |
| 1 | 0 | −1 | 0 | 0 | 1 | 0 | 0 | 0 | 0 | −1 | −1 |
| 0 | 0 | 1 | 1 | 0 | 0 | −1 | 1 | 0 | 1 | −1 | 0 |
| 1 | 0 | 0 | 0 | 0 | 0 | 1 | 0 | 1 | 0 | 0 | 0 |
| 0 | 1 | 0 | 0 | 0 | −1 | 0 | −1 | 0 | 1 | 0 | 0 |
| 0 | 0 | 1 | 0 | 0 | 0 | 0 | 1 | 0 | 0 | 1 | 0 |
| 0 | 0 | 0 | 1 | −1 | 0 | 0 | −1 | 0 | 0 | 0 | 1 |

TABLE 1B

Third Alternative Bases for Strassen's <2, 2, 2; 7>-algorithm.

| phi | | | | psi | | | | upsilon | | | |
|---|---|---|---|---|---|---|---|---|---|---|---|
| 1 | 0 | 0 | 1 | 1 | 0 | 0 | 1 | 1 | 0 | −1 | 0 |
| 0 | 0 | 1 | 1 | 1 | 0 | 0 | 0 | 0 | 1 | 0 | 0 |
| 1 | 0 | 0 | 0 | −1 | 0 | 1 | 0 | 0 | 0 | 1 | 0 |
| 1 | 1 | 0 | 0 | 1 | 1 | 0 | 0 | −1 | −1 | 1 | 1 |

| U | | | | V | | | | W | | | |
|---|---|---|---|---|---|---|---|---|---|---|---|
| 1 | 0 | 0 | 0 | 1 | 0 | 0 | 0 | 1 | 0 | 0 | 0 |
| 0 | 1 | 0 | 0 | 0 | 1 | 0 | 0 | −1 | 0 | 1 | 0 |
| 0 | 0 | 1 | 0 | −1 | 0 | 0 | 1 | 0 | 1 | 0 | 0 |
| 1 | 0 | −1 | 0 | 0 | 0 | 1 | 0 | 0 | 0 | 1 | 0 |
| 0 | 0 | 0 | 1 | 1 | −1 | 0 | 0 | −1 | 1 | 0 | 0 |
| −1 | 1 | 0 | 0 | 0 | 0 | 1 | 0 | 0 | 0 | 0 | 1 |
| −1 | 0 | 0 | 1 | 1 | 0 | 1 | 0 | 1 | 0 | 0 | −1 |

Following are alternative basis transformations for other matrix multiplication algorithms. For example, an alternative basis variant of Ballard and Benson's <3, 2, 3; 15>-algorithm is determined from sparsification techniques as defined in TABLE 2A and TABLE 2B. For example, an alternative basis variant of Ballard and Benson's <4, 2, 3; 20>-algorithm is determined from sparsification techniques as defined in TABLE 3A and TABLE 3B. For example, an alternative basis variant of Ballard and Benson's <3, 3, 3; 23>-algorithm is determined from sparsification techniques as defined in TABLE 4A and TABLE 4B. Similarly, alternative basis variants of Smirnov's <6, 3, 3; 40>-algorithm may be determined, such as those presented in TABLE 5A and TABLE 5B.

The basis transformation matrices described herein, and/or other that may be determined by similar methods, may be applied to hardware processors, software kernels, and/or the like, to speed up linear algebra, matrix multiplications, simulations, modeling, finite element analyses, dynamic/turbulent flow analyses, weather modeling, automated vehicle operation, and/or the like. The improved methods for matrix processing and/or linear algebra may be applied to all computing devices that perform mathematical processing operations, and speed up the execution time of these operations. Thus, the processors/kernels using these techniques will have a competitive processing performance over others, that do not use these techniques.

TABLE 2A

Alternative Bases for variant of Ballard and Benson's <3, 2, 3; 15>-algorithm.

| φ | ψ | | | | $V^{-T}$ | | | | | |
|---|---|---|---|---|---|---|---|---|---|---|
| id | id | 0 | 0 | -1 | 0 | 0 | 0 | 0 | 0 | 0 |
|  |  | 0 | 0 | -1 | 0 | 0 | 0 | 0 | -1 | 0 |
|  |  | -1 | 1 | 0 | 0 | 0 | 0 | 0 | 1 | 0 |
|  |  | 0 | 0 | 1 | 0 | 0 | 1 | -1 | 0 | 0 |
|  |  | -1 | 1 | 0 | 0 | 1 | 0 | 0 | 0 | 0 |
|  |  | 0 | 0 | -1 | 0 | 0 | -1 | 0 | 0 | 0 |
|  |  | 0 | 0 | 1 | 1 | 0 | 1 | 0 | 0 | 0 |
|  |  | 0 | 0 | 1 | 0 | 0 | 1 | 0 | -1 | 1 |
|  |  | 1 | 0 | 0 | 0 | 0 | 0 | 0 | 0 | 0 |

TABLE 2B

Alternative Basis variant of Ballard and Benson's <3, 2, 3; 15>-algorithm.

| U | | | | | | | V | | | | | | | W | | | | | |
|---|---|---|---|---|---|---|---|---|---|---|---|---|---|---|---|---|---|---|---|
| 0 | -1 | 0 | 1 | 0 | 1 | 0 | 0 | 0 | 0 | 1 | 1 | 1 | 0 | 0 | 0 | 0 | 0 | 0 | 0 |
| -1 | 0 | 1 | 0 | 0 | 1 | 0 | 0 | 1 | 0 | -1 | 0 | 0 | 1 | 0 | 0 | 0 | 0 | 0 | 0 |
| -1 | 0 | 1 | 0 | 0 | 0 | 0 | -1 | 0 | 0 | -1 | 0 | 0 | 0 | 1 | 0 | 0 | 0 | 0 | 0 |
| 0 | 0 | 0 | 1 | 0 | -1 | 1 | 0 | 0 | 1 | -1 | 0 | 1 | 0 | 0 | 1 | 0 | 0 | 0 | 0 |
| -1 | 1 | 1 | 0 | 0 | 0 | 1 | 1 | 0 | 1 | 0 | 0 | 0 | 0 | 0 | 1 | 0 | 0 | 0 | 0 |
| 0 | 0 | 1 | 0 | 0 | 1 | 0 | 0 | 0 | 1 | 0 | 0 | 0 | 0 | -1 | -1 | 0 | 1 | 0 | 0 |
| 0 | 0 | -1 | 1 | 1 | -1 | 0 | 0 | 0 | 1 | 0 | -1 | 0 | 0 | 0 | 0 | 1 | 0 | 0 | 0 |
| 0 | 0 | 0 | 1 | 0 | 0 | 0 | 0 | 1 | 0 | 0 | 0 | 0 | 0 | 0 | 0 | 1 | 0 | 0 | 0 |
| -1 | 0 | 1 | 0 | 1 | 0 | 0 | 1 | 1 | 0 | 0 | 0 | 1 | -1 | 0 | 0 | 0 | 0 | 0 | 0 |
| -1 | 1 | 0 | 0 | 0 | -1 | -1 | 0 | 0 | 0 | 0 | 0 | 0 | 0 | 1 | 0 | 0 | 0 | 0 | 1 |
| 0 | 0 | 0 | 0 | 1 | 0 | 0 | 1 | 0 | 0 | 1 | 0 | -1 | 0 | -1 | 0 | 0 | 0 | 1 | 0 |
| 0 | 0 | 0 | 0 | 1 | -1 | 0 | 0 | 1 | 0 | 0 | 0 | 0 | 0 | 0 | 0 | 0 | 0 | 1 | 0 |
| 0 | 1 | 0 | 0 | 0 | 0 | 1 | 1 | 0 | 1 | 1 | 0 | 0 | 0 | 0 | 0 | 0 | 0 | 0 | 1 |
| 0 | 0 | 1 | 0 | -1 | 0 | 1 | 0 | -1 | 1 | 0 | -1 | 0 | 0 | 1 | 0 | 1 | 0 | 0 | 0 |
| -1 | 1 | 1 | -1 | 0 | 0 | 0 | 0 | 0 | 0 | 1 | 0 | 0 | 1 | 1 | 0 | -1 | 0 | 0 | 0 |

TABLE 3A

Alternative Bases for variant of Ballard and Benson's <4, 2, 3; 20>-algorithm.

| φ | ψ | | | | | $V^{-T}$ | | | | | | |
|---|---|---|---|---|---|---|---|---|---|---|---|---|
| id | id | 0 | 0 | 0 | 0 | 0 | 0 | 0 | 1 | 0 | 0 | 0 |
|  |  | 0 | 0 | 0 | -1 | 0 | 0 | 0 | 0 | 0 | 1 | 0 |
|  |  | 0 | -1 | -1 | -1 | 1 | 1 | 0 | 1 | 0 | 0 | 0 |
|  |  | -1 | 0 | 0 | 0 | 0 | 0 | 1 | 0 | 0 | 0 | 0 |
|  |  | 0 | 0 | 0 | 1 | 0 | 0 | 0 | 0 | 0 | 0 | 0 |
|  |  | 0 | 0 | 0 | -1 | 0 | 0 | 0 | -1 | 0 | 1 | 1 |
|  |  | 1 | 0 | 0 | 0 | 0 | 0 | 0 | 0 | 0 | 0 | 0 |
|  |  | 0 | 0 | 0 | 1 | -1 | 0 | 0 | 0 | 0 | 0 | 0 |
|  |  | 0 | 0 | -1 | -1 | 1 | 1 | 0 | 0 | 0 | 0 | 0 |
|  |  | 0 | 0 | 0 | 0 | 0 | 0 | 1 | 1 | -1 | -1 | 0 |
|  |  | 1 | 0 | 0 | 0 | 0 | -1 | 0 | 1 | 1 | -1 | -1 |
|  |  | 0 | 0 | 0 | -1 | 1 | 1 | 0 | 0 | 0 | 0 | 0 |

TABLE 3B

Alternative Basis variant of Ballard and Benson's <4, 2, 3; 20>-algorithm.

| U | | | | | | | | | | V | | | | | | | | | |
|---|---|---|---|---|---|---|---|---|---|---|---|---|---|---|---|---|---|---|---|
| 0 | 0 | 0 | 0 | -1 | -1 | 0 | 0 | 1 | 0 | 0 | 0 | 0 | 0 | | | | | | |
| 0 | 0 | 0 | 0 | -1 | 0 | -1 | 0 | 0 | 0 | -1 | 0 | 0 | 0 | | | | | | |
| 0 | 0 | 0 | 1 | 0 | 0 | -1 | 0 | 0 | -1 | 1 | -1 | 0 | -1 | | | | | | |
| 1 | 0 | 0 | 0 | 0 | 0 | 0 | 0 | 0 | -1 | 0 | 0 | 1 | 0 | | | | | | |
| -1 | 0 | 0 | 0 | 0 | 1 | 0 | 0 | 1 | 0 | 0 | 0 | 1 | 0 | | | | | | |
| 0 | 0 | 1 | 0 | 0 | 0 | 1 | 0 | 1 | 1 | 0 | 0 | 0 | 0 | | | | | | |
| 1 | 1 | 0 | 0 | 0 | 0 | 0 | 0 | 0 | 0 | 0 | 0 | 1 | 0 | | | | | | |
| 0 | 0 | 0 | 0 | 0 | 1 | 0 | 1 | 0 | 1 | -1 | 0 | -1 | | | | | | | |
| 0 | 1 | 0 | 0 | 0 | 1 | 0 | 0 | 0 | 0 | 0 | 1 | 1 | 0 | | | | | | |
| 0 | 0 | 1 | 1 | 0 | 0 | 0 | 0 | -1 | 1 | 0 | 0 | 0 | | | | | | | |
| 0 | 0 | 0 | 0 | 1 | 0 | 1 | 0 | 0 | 0 | 0 | 0 | 0 | 1 | | | | | | |
| -1 | 0 | 0 | 1 | 0 | 0 | 0 | 0 | -1 | 1 | 0 | 1 | 0 | | | | | | | |
| 0 | 0 | 0 | 0 | -1 | 1 | 0 | 1 | 0 | 0 | -1 | 0 | -1 | | | | | | | |
| 0 | 0 | 0 | 0 | 0 | 1 | 1 | 0 | 0 | 0 | 1 | 0 | 1 | | | | | | | |
| 0 | 0 | 0 | 0 | 1 | 0 | 0 | 1 | 0 | 0 | -1 | 0 | 0 | | | | | | | |
| 0 | 1 | 0 | 1 | 0 | 0 | 0 | 0 | 0 | 0 | 0 | 0 | 1 | | | | | | | |
| 0 | 0 | 0 | -1 | 0 | 0 | 0 | -1 | 0 | 0 | 0 | -1 | -1 | 0 | | | | | | |
| 1 | 0 | 0 | 0 | 1 | 0 | 0 | 0 | 1 | 1 | 0 | 0 | 0 | 0 | | | | | | |
| 0 | 0 | 0 | -1 | 0 | 0 | 0 | 0 | -1 | 1 | 0 | 1 | -1 | | | | | | | |
| 1 | 0 | 1 | 0 | 0 | 0 | 0 | 0 | 0 | 0 | 1 | 0 | 0 | 0 | | | | | | |

TABLE 3B-continued

Alternative Basis variant of Ballard and Benson's <4, 2, 3; 20>-algorithm.

| W | | | | | | | | | | | |
|---|---|---|---|---|---|---|---|---|---|---|---|
| 0 | 0 | 0 | 1 | 0 | 0 | 0 | 0 | 0 | -1 | 1 | 0 |
| 1 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 |
| 0 | 0 | 0 | 1 | 0 | 0 | 0 | 0 | 0 | 0 | 0 | 0 |
| 0 | 0 | 0 | 0 | 1 | 0 | 0 | 0 | 0 | 0 | 0 | 0 |
| 0 | 0 | -1 | 1 | 0 | 0 | 0 | 1 | 0 | 0 | 0 | 0 |
| 0 | 0 | 0 | 0 | 0 | 1 | 0 | 0 | 0 | 0 | 0 | 0 |
| 0 | 0 | 0 | 0 | 0 | 0 | 1 | 0 | 0 | 0 | 0 | 0 |
| 1 | 0 | 0 | 0 | 0 | 0 | 0 | 0 | -1 | 0 | 0 | 0 |
| 0 | 0 | 0 | 0 | 0 | 0 | 0 | 1 | 0 | 0 | 0 | 0 |
| 0 | 0 | 0 | 0 | 0 | 0 | 0 | 0 | 1 | 0 | 0 | 0 |
| 0 | -1 | 0 | 0 | 1 | 0 | 0 | 0 | 1 | 0 | 0 | 0 |
| 0 | 0 | 0 | 0 | 0 | 0 | 0 | 0 | 0 | 1 | 0 | 0 |
| 0 | 0 | 0 | 0 | 0 | 0 | 0 | -1 | 0 | 0 | 0 | 1 |
| 0 | 1 | 0 | 0 | 1 | 0 | 0 | 0 | 0 | 0 | 0 | 0 |
| 0 | 0 | 0 | 1 | 0 | 0 | 1 | 0 | 0 | 0 | 0 | 0 |

TABLE 3B-continued

Alternative Basis variant of Ballard and Benson's <4, 2, 3; 20>-algorithm.

| 0 | 1 | 0 | 0 | 0 | 0 | 0 | 1 | 1 | 0 | 0 | 0 |
| 0 | 0 | 0 | 0 | 0 | 0 | 0 | 0 | 0 | 0 | 0 | 1 |

TABLE 4A

Alternative Bases for variant of Ballard and Benson's <3, 3, 3; 23>-algorithm.

| φ | ψ | $v^{-T}$ | | | | | | | | |
|---|---|---|---|---|---|---|---|---|---|---|
| id | id | 0 | 0 | 0 | 0 | 0 | 0 | 0 | −1 | 0 |
|    |    | 0 | 0 | 1 | 0 | 0 | 0 | 0 | 1  | 0 |
| 0 | 0  | 1 | 0 | 0 | 0 | 1 | 0 | −1 |
| 1 | 0  | 0 | 0 | 0 | 0 | 0 | 0 | 0  |
| 0 | −1 | 0 | 0 | 0 | 0 | 0 | 1 | 0  |
| 0 | 0  | 0 | 1 | 0 | 0 | 0 | 0 | 0  |
| 0 | 0  | 1 | 0 | 0 | 1 | 0 | 1 | 0  |
| 0 | 0  | 0 | 0 | 1 | 0 | 0 | 0 | 0  |
| 0 | 0  | 1 | 0 | 0 | 0 | 0 | 0 | −1 |

TABLE 4B

Alternative Basis variant of Ballard and Benson's <3, 3, 3; 23>-algorithm.

| U | | | | | | | | | V | | | | | | | |
|---|---|---|---|---|---|---|---|---|---|---|---|---|---|---|---|---|
| −1 | 1  | 0  | 1  | 0  | 0  | 0  | 0  | 0  | 0  | 0  | 0 | 1  | 0  | 0  | 0  | 0  |
| 1  | 0  | 1  | 0  | 0  | 0  | 1  | 0  | 1  | 0  | −1 | 1 | 0  | 0  | 0  | 0  | 0  |
| 1  | 0  | 0  | −1 | 0  | 0  | 0  | 1  | 0  | 0  | 1  | 0 | 1  | 0  | 0  | 0  | 0  |
| 0  | 0  | −1 | 0  | 0  | 1  | 0  | 1  | 0  | 0  | 0  | 1 | 0  | 0  | −1 | 0  | −1 |
| 0  | −1 | 0  | 0  | 0  | 0  | 0  | −1 | 0  | 0  | 0  | 0 | 1  | −1 | 0  | 0  | 0  |
| 0  | 1  | 0  | 0  | 0  | 0  | 0  | 0  | 0  | 0  | 0  | 1 | 0  | 0  | 0  | 0  | 0  |
| 0  | 0  | −1 | 0  | 0  | 1  | 0  | 0  | 0  | 0  | 0  | −1| 0  | 0  | 1  | 0  | 0  |
| 0  | 0  | −1 | 0  | 0  | 1  | 0  | 0  | −1 | 0  | 0  | 0 | 0  | 0  | 0  | 0  | 1  |
| −1 | 0  | 0  | 1  | 0  | 0  | 0  | 0  | 0  | −1 | 1  | 0 | 1  | 0  | 0  | 0  | 0  |
| 0  | 0  | 0  | −1 | −1 | −1 | 0  | 0  | 0  | 0  | 0  | 0 | 0  | 0  | 0  | 1  | 0  |
| 0  | 0  | 0  | 0  | 0  | 0  | 1  | 1  | 0  | 0  | 0  | 0 | 0  | 0  | 1  | 0  | 1  |
| 1  | 0  | 1  | 0  | 0  | 0  | 0  | 0  | 1  | 0  | 0  | 0 | 0  | 0  | 0  | 0  | 0  |
| 0  | 0  | −1 | 0  | 0  | 0  | 0  | 0  | 1  | 0  | 0  | 0 | 0  | −1 | 0  | 0  | 0  |
| 0  | 0  | −1 | 0  | 1  | 1  | 0  | 0  | 0  | 0  | 0  | 1 | 0  | 0  | 0  | −1 | 0  |
| 0  | 0  | 1  | 1  | 0  | 0  | 0  | 1  | 0  | −1 | 1  | 0 | 0  | 0  | 0  | 1  | 0  |
| 0  | 0  | 0  | 0  | 1  | 0  | 0  | 0  | 0  | 0  | 0  | 0 | 1  | 0  | 0  | −1 | 0  |
| 0  | 0  | 0  | 0  | 0  | 0  | −1 | 0  | 0  | −1 | 0  | 0 | 0  | 0  | 0  | 0  | 0  |
| 0  | 0  | 0  | 0  | 0  | 0  | 1  | −1 | 0  | 0  | 0  | 1 | 0  | 0  | 0  | 0  | 0  |
| 0  | 0  | 0  | 0  | 0  | 0  | −1 | 0  | 0  | 0  | 1  | 1 | 0  | 1  | −1 | 0  | −1 |
| 0  | 0  | −1 | 0  | 0  | 0  | 0  | −1 | 0  | −1 | 1  | 0 | 0  | 0  | 0  | 1  | −1 |
| 0  | 0  | 0  | −1 | 0  | 0  | 0  | 0  | 0  | 0  | −1 | 0 | 0  | 0  | 0  | 1  | 0  |
| 0  | 0  | 0  | 0  | 1  | 0  | 0  | 0  | 0  | 0  | 0  | 0 | 0  | 1  | 0  | 0  | 0  |
| 0  | 0  | −1 | −1 | 0  | 0  | 0  | 0  | 0  | −1 | 0  | 0 | 0  | 0  | 0  | 1  | 0  |

| W | | | | | | | | |
|---|---|---|---|---|---|---|---|---|
| 0 | 1  | 0 | 0 | −1 | 0  | 0 | 0  | 0  |
| 1 | 0  | 0 | 0 | 0  | 0  | 0 | 0  | 0  |
| 0 | 1  | 0 | 0 | 0  | 0  | 0 | 0  | 0  |
| 0 | 0  | 1 | 0 | 0  | 0  | 0 | 0  | 0  |
| 1 | 1  | 0 | 0 | 0  | 0  | 0 | 0  | 0  |
| 0 | 0  | 0 | 1 | 0  | 0  | 0 | 0  | 0  |
| 0 | 0  | 1 | 0 | 0  | 1  | 0 | 0  | 0  |
| 0 | −1 | 1 | 0 | 0  | 0  | 1 | 0  | 0  |
| 0 | 0  | 0 | 0 | 1  | 0  | 0 | 0  | 0  |
| 0 | 0  | 0 | 0 | 0  | −1 | 0 | −1 | 0  |
| 0 | 0  | 1 | 0 | 0  | 0  | 0 | 0  | −1 |
| 0 | 0  | 0 | 1 | −1 | 0  | 0 | 0  | 0  |
| 0 | 0  | 0 | 1 | 0  | 1  | 0 | 0  | 0  |
| 0 | 0  | 0 | 0 | 0  | 1  | 0 | 0  | 0  |
| 0 | 0  | 0 | 0 | 0  | 0  | 1 | 0  | 0  |
| 0 | 0  | 0 | 0 | 0  | 0  | 0 | 1  | 0  |
| 0 | 0  | 1 | 0 | 0  | 0  | 0 | 0  | −1 |
| 0 | 1  | 0 | 0 | 0  | 0  | 0 | 0  | −1 |
| 0 | 0  | 0 | 0 | 0  | 0  | 0 | 0  | 1  |
| 1 | 0  | 0 | 0 | 0  | 0  | 1 | 0  | 0  |
| 0 | 0  | 0 | 0 | −1 | 0  | 1 | 1  | 0  |
| 0 | −  | 0 | 0 | 0  | 0  | 1 | 0  | 0  |
| 0 | 0  | 0 | 0 | 1  | 1  | 0 | 0  | 0  |

TABLE 5A

A first Alternative Basis for Smirnov's <6, 3, 3; 40>-algorithm.

phi

| | | | | | | | | |
|---|---|---|---|---|---|---|---|---|
| −0.125 | −0.125 | 0 | −1 | 0 | 1 | 0 | 1 | 0 |
| 0.125 | 0.125 | 0 | 0 | 1 | 0 | −1 | 0 | 1 |
| 0 | 0 | −0.125 | 0 | 1 | 0 | −1 | 0 | 1 |
| −0.125 | 0.125 | 0 | 1 | 0 | −1 | 0 | 1 | 0 |
| −0.125 | 0.125 | 0 | 0 | −1 | 0 | −1 | 0 | 1 |
| 0 | 0 | 0.125 | 1 | 0 | 1 | 0 | 1 | 0 |
| 0 | 0 | 0.125 | 0 | −1 | 0 | −1 | 0 | −1 |
| 0.125 | −0.125 | 0 | 1 | 0 | 1 | 0 | 1 | 0 |
| 0 | 0 | −0.125 | 0 | 1 | 0 | 1 | 0 | −1 |
| 0 | 0 | −0.125 | 1 | 0 | 1 | 0 | −1 | 0 |
| −0.125 | −0.125 | 0 | 0 | 1 | 0 | −1 | 0 | −1 |
| 0 | 0 | −0.125 | 0 | 1 | 0 | −1 | 0 | −1 |
| −0.125 | −0.125 | 0 | 0 | 1 | 0 | 0 | 1 | 0 |
| 0 | 0 | 0.125 | 1 | 0 | 1 | 1 | 0 | −1 |
| −0.125 | −0.125 | 0 | −1 | 0 | 1 | 1 | 0 | −1 |
| −0.125 | 0.125 | 0 | −1 | 0 | −1 | −1 | 0 | 1 |
| −0.125 | 0.125 | 0 | −1 | 0 | −1 | 1 | 0 | 1 |
| 0.125 | −0.125 | 0 | 0 | 1 | 0 | 0 | −1 | 0 | phi

| | | | | | | | | |
|---|---|---|---|---|---|---|---|---|
| 0 | 1 | 1 | 0 | 0 | −0.125 | 1 | 0 | 0 |
| −1 | 0 | 0 | 0 | 0 | 0.125 | 0 | −1 | −1 |
| 0 | 1 | 1 | −0.125 | −0.125 | 0 | 1 | 0 | 0 |
| 0 | −1 | 1 | 0 | 0 | −0.125 | 1 | 0 | 0 |
| 1 | 0 | 0 | 0 | 0 | −0.125 | 0 | −1 | 1 |
| −1 | 0 | 0 | −0.125 | 0.125 | 0 | 0 | 1 | 1 |
| 0 | 1 | 1 | −0.125 | 0.125 | 0 | −1 | 0 | 0 |
| 0 | −1 | −1 | 0 | 0 | −0.125 | 1 | 0 | 0 |
| 0 | −1 | 1 | −0.125 | 0.125 | 0 | 1 | 0 | 0 |
| 1 | 0 | 0 | 0.125 | 0.125 | 0 | 0 | 1 | −1 |
| −1 | 0 | 0 | 0 | 0 | 0.125 | 0 | −1 | 1 |
| 0 | 1 | −1 | 0.125 | 0.125 | 0 | 1 | 0 | 0 |
| 0 | 1 | 1 | −0.125 | −0.125 | 0 | 0 | −1 | 1 |
| 0 | −1 | −1 | 0 | 0 | −0.125 | 0 | 1 | 1 |
| 1 | 0 | 0 | −0.125 | 0.125 | 0 | 1 | 0 | 0 |
| 1 | 0 | 0 | 0.125 | −0.125 | 0 | −1 | 0 | 0 |
| −1 | 0 | 0 | −0.125 | −0.125 | 0 | −1 | 0 | 0 |
| 0 | 1 | −1 | 0.125 | 0.125 | 0 | 0 | 1 | −1 | psi

| | | | | | | | | |
|---|---|---|---|---|---|---|---|---|
| 1 | 0 | 1 | 0 | 1 | 1 | −1 | 1 | 0 |
| 1 | 0 | −1 | 0 | 1 | −1 | −1 | 1 | 0 |
| −1 | 0 | −1 | 0 | 1 | −1 | 1 | 1 | 0 |
| −1 | 0 | 1 | 0 | −1 | −1 | 1 | 1 | 0 |
| 1 | 0 | 1 | 0 | 1 | −1 | 1 | 1 | 0 |
| 1 | 0 | 1 | 0 | −1 | 1 | 1 | 1 | 0 |
| −1 | 0 | −1 | −1 | 0 | −1 | 0 | 0 | 0 |
| 0 | 0 | 0 | 0 | −1 | 1 | 0 | −1 | 1 |
| 0 | 1 | −1 | 0 | 1 | −1 | 0 | 0 | 0 | upsilon

| | | | | | | | | |
|---|---|---|---|---|---|---|---|---|
| 0.25 | 0 | 0.25 | −2 | 0 | −2 | −2 | 2 | 0 |
| 0 | 0 | 0 | −2 | 2 | 0 | 0 | 0 | 0 |
| −0.25 | −0.25 | 0 | 0 | 0 | 0 | 2 | 2 | 0 |
| 0 | 0 | 0 | −2 | 0 | 2 | 0 | 0 | 0 |
| 0 | 0 | 0 | 0 | 0 | 0 | −2 | 0 | −2 |
| 0 | 0 | 0 | −2 | 2 | 0 | 2 | 0 | −2 |
| −0.25 | 0.25 | 0 | 0 | 0 | 0 | 2 | −2 | 0 |
| 0 | −0.25 | 0.25 | 0 | 0 | 0 | 0 | 2 | −2 |
| −0.25 | 0 | 0.25 | 0 | 0 | 0 | −2 | 0 | 2 |
| −0.25 | 0 | −0.25 | 2 | 0 | 2 | 0 | 0 | 0 |
| 0.25 | 0.25 | 0 | 2 | 2 | 0 | 0 | 0 | 0 |
| 0 | 0 | 0 | 0 | 2 | 2 | 0 | 0 | 0 |
| 0 | 0 | 0 | 2 | 2 | 0 | −2 | −2 | 0 |
| 0 | −0.25 | −0.25 | 0 | 0 | 0 | 0 | 0 | 0 |
| 0 | 0.25 | −0.25 | 0 | 0 | 0 | 0 | 0 | 0 |
| −0.25 | 0 | −0.25 | 2 | 0 | 2 | 2 | 0 | 2 |
| −0.25 | 0 | 0.25 | −2 | 0 | 2 | −2 | 0 | 2 |
| 0 | 0 | 0 | 2 | −2 | 0 | −2 | 2 | 0 |

TABLE 5A-continued

A first Alternative Basis for Smirnov's <6, 3, 3; 40>-algorithm.

upsilon

| | | | | | | | | |
|---|---|---|---|---|---|---|---|---|
| 0 | 2 | 2 | 0.25 | −0.25 | 0 | 0 | 0 | 0 |
| 0 | 0 | 0 | −0.25 | 0.25 | 0 | 2 | −2 | 0 |
| 0 | 0 | 0 | 0 | 0 | 0 | −2 | −2 | 0 |
| 0 | 0 | 0 | −0.25 | 0 | 0.25 | −2 | 0 | 2 |
| 2 | 0 | 2 | 0.25 | 0 | 0.25 | 0 | 0 | 0 |
| 2 | 0 | −2 | 0 | 0.25 | −0.25 | 2 | −2 | 0 |
| 0 | 0 | 0 | 0 | 0 | 0 | 2 | −2 | 0 |
| 0 | 0 | 0 | 0 | 0 | 0 | 0 | −2 | 2 |
| 0 | 0 | 0 | 0 | 0 | 0 | −2 | 0 | 2 |
| −2 | 0 | −2 | 0 | 0 | 0 | 0 | 0 | 0 |
| 2 | 2 | 0 | 0 | 0 | 0 | 0 | 0 | 0 |
| 0 | 0 | 0 | 0 | 0.25 | 0.25 | 0 | 2 | 2 |
| 2 | 2 | 0 | 0 | 0 | 0 | 2 | 2 | 0 |
| 0 | −2 | −2 | 0 | 0.25 | 0.25 | 0 | 2 | 2 |
| 0 | −2 | 2 | 0 | −0.25 | 0.25 | 0 | 2 | 2 |
| 0 | 0 | 0 | −0.25 | 0 | −0.25 | 0 | 0 | 0 |
| 0 | 0 | 0 | −0.25 | 0 | 0.25 | 0 | 0 | 0 |
| −2 | 2 | 0 | 0 | 0 | 0 | −2 | 2 | 0 |

U

| | | | | | | | | | | | | | | | | | |
|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 |
| 0 | 0 | 0 | −1 | 1 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 1 | 1 | 0 | −1 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 |
| 1 | 1 | −1 | 0 | 0 | 0 | 0 | 0 | 0 | 0 | 0 | 0 | 0 | 0 | 0 | 0 | 0 | 0 |
| 0 | 0 | 0 | 0 | 0 | 1 | −1 | −1 | 0 | 0 | 0 | 0 | 0 | 0 | 0 | 0 | 0 | 0 |
| 0 | 0 | 1 | 0 | 0 | 0 | 0 | −1 | 0 | 0 | 0 | 0 | 1 | 0 | 0 | 0 | 0 | 0 |
| −1 | 0 | 1 | 1 | 0 | 0 | 0 | 0 | −1 | 0 | 0 | 0 | 0 | 1 | 0 | 0 | 0 | 0 |
| 0 | 1 | 0 | 0 | 0 | −1 | 0 | 0 | 0 | 0 | 0 | 0 | 1 | 0 | 0 | 0 | 0 | 0 |
| −1 | 0 | 0 | 0 | 0 | 0 | 0 | 0 | 0 | −1 | 0 | 1 | 0 | 0 | 0 | 0 | 0 | 0 |
| 0 | 0 | 0 | 0 | 1 | 0 | 0 | 1 | 0 | 0 | 0 | 0 | 0 | 1 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 |
| 1 | 1 | 0 | 0 | 0 | −1 | 1 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 0 | 1 | 0 | 0 | 0 |
| −1 | 0 | 0 | 1 | −1 | 0 | 0 | 0 | −1 | 0 | 0 | 0 | 0 | 1 | 0 | 0 | 0 | 0 |
| 0 | 0 | 0 | 0 | 0 | 0 | 0 | 1 | 0 | 1 | 0 | 0 | 0 | 0 | 0 | 1 | 0 | 0 |
| 0 | 0 | 0 | 0 | 0 | 1 | −1 | −1 | 0 | 0 | 0 | −1 | 0 | 0 | 0 | −1 | 0 | 0 |
| 0 | 0 | 0 | 0 | −1 | 0 | 0 | 0 | 0 | 1 | 0 | 0 | 0 | 0 | 0 | 0 | 0 | −1 |
| 0 | 0 | 0 | 1 | 0 | 0 | 0 | 0 | 0 | 0 | −1 | 0 | 0 | 0 | 0 | 0 | 0 | 1 |
| 0 | 1 | 0 | 0 | 0 | 0 | 0 | 0 | −1 | 0 | 0 | 0 | 1 | 0 | 0 | 0 | 0 | 0 |
| 0 | 0 | 0 | 0 | 0 | 1 | 1 | 0 | 1 | 1 | 0 | 0 | 0 | 0 | 0 | 1 | 0 | 0 |
| 0 | 1 | −1 | 0 | 0 | 0 | 0 | 0 | 0 | −1 | 1 | 1 | 0 | 0 | 0 | 0 | 0 | 0 |
| 0 | 0 | −1 | 0 | 0 | 0 | 0 | 0 | 1 | 0 | 0 | 1 | 0 | 0 | 0 | 0 | 0 | 0 |
| 0 | 0 | 0 | 0 | 0 | 0 | 0 | 0 | 0 | 0 | 0 | 0 | 0 | 0 | 0 | 1 | 0 | 0 |
| 0 | 0 | 0 | 0 | −1 | 0 | 0 | 0 | −1 | 0 | −1 | 1 | 0 | 0 | 0 | 0 | 0 | −1 |
| 0 | 0 | 0 | 0 | 0 | 0 | 0 | 0 | 0 | 0 | 0 | 0 | 0 | 0 | 0 | 0 | 0 | 1 |
| 0 | 0 | 0 | −1 | 0 | 0 | 1 | 1 | 1 | 0 | 0 | 0 | 0 | 0 | 0 | 1 | 0 | 0 |
| 0 | 0 | 0 | 0 | −1 | 0 | 0 | 1 | 0 | 0 | 0 | 0 | 0 | 0 | 0 | 1 | 0 | 0 |

V

| | | | | | | | | |
|---|---|---|---|---|---|---|---|---|
| 1 | 0 | 0 | 0 | 0 | 0 | 0 | 0 | 0 |
| 0 | 1 | 0 | 0 | 0 | 0 | 0 | 0 | 0 |
| 0 | 0 | 1 | 0 | 0 | 0 | 0 | 0 | 0 |
| 0 | 0 | 0 | 1 | 0 | 0 | 0 | 0 | 0 |
| 0 | 0 | −1 | 0 | 1 | −1 | 0 | 0 | 0 |
| 1 | 0 | 0 | 1 | 0 | −1 | 0 | 0 | 0 |
| 1 | 0 | 1 | 0 | −1 | 0 | 0 | 0 | 0 |
| 0 | 0 | 0 | 0 | 1 | 0 | 0 | 0 | 0 |
| 0 | −1 | 0 | 0 | 1 | −1 | 0 | 0 | 0 |
| 0 | −1 | 1 | −1 | 0 | 0 | 0 | 0 | 0 |
| 0 | 0 | 0 | 0 | 0 | 1 | 0 | 0 | 0 |
| 0 | −1 | 0 | −1 | 1 | 0 | 0 | 0 | 0 |

TABLE 5A-continued

A first Alternative Basis for Smirnov's <6, 3, 3; 40>-algorithm.

| | | | | | | | | |
|---|---|---|---|---|---|---|---|---|
| 1 | 0 | 0 | 1 | -1 | 0 | 0 | 0 | 0 |
| 1 | -1 | 0 | 0 | 0 | -1 | 0 | 0 | 0 |
| 1 | -1 | 1 | 0 | 0 | 0 | 0 | 0 | 0 |
| 0 | 0 | 1 | -1 | 0 | 1 | 0 | 0 | 0 |
| 0 | 0 | -1 | 0 | 0 | 0 | 1 | 0 | 0 |
| 0 | 0 | -1 | 0 | 0 | 0 | 0 | 0 | 1 |
| 1 | 0 | 0 | 0 | 0 | 0 | 1 | 0 | 0 |
| 1 | -1 | 0 | 0 | 0 | 0 | 0 | 0 | 1 |
| 0 | 0 | 0 | 1 | 0 | -1 | -1 | 0 | 0 |
| 0 | 0 | 0 | 0 | 0 | 0 | 1 | 0 | 0 |
| 0 | 0 | 0 | 0 | 0 | 0 | 0 | 1 | 0 |
| -1 | 0 | -1 | 0 | 0 | 0 | 0 | -1 | 0 |
| 0 | -1 | 0 | 0 | 0 | 0 | 0 | 0 | 1 |
| 0 | 0 | 0 | 0 | 1 | -1 | 0 | 0 | -1 |
| 0 | 0 | -1 | 0 | 0 | 0 | 0 | -1 | 0 |
| 0 | 0 | 0 | 0 | -1 | 0 | 0 | -1 | 0 |
| -1 | 0 | 0 | -1 | 0 | 1 | 0 | -1 | 0 |
| 0 | 0 | 0 | 0 | 1 | -1 | 0 | 1 | 0 |
| 0 | 1 | 0 | 1 | 0 | 0 | 0 | 1 | 0 |
| 0 | 1 | 0 | 0 | 0 | 0 | 0 | 1 | 0 |
| -1 | 0 | 0 | -1 | 1 | 0 | 0 | 0 | -1 |
| -1 | 1 | 0 | 0 | 0 | 0 | -1 | 0 | 0 |
| 0 | 0 | 0 | 0 | 0 | 0 | 0 | 0 | 1 |
| 0 | 0 | 0 | 0 | 0 | 1 | 0 | 0 | 1 |
| 0 | -1 | 0 | -1 | 1 | 0 | 1 | 0 | 0 |
| 0 | 0 | 0 | 0 | 0 | 1 | 1 | 0 | 0 |
| 0 | 0 | 1 | -1 | 0 | 0 | 0 | 0 | -1 |
| 0 | 0 | 1 | 0 | -1 | 0 | -1 | 0 | 0 |

W

| | | | | | | | | | | | | | | | | |
|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 |
| -1 | 0 | 0 | 0 | 0 | 0 | 1 | 0 | 0 | 1 | 0 | 0 | 0 | 0 | 0 | 0 | 0 |
| 0 | 0 | 1 | 0 | 1 | 0 | 0 | 1 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 |
| 0 | 1 | 0 | 0 | 0 | 1 | 0 | 0 | -1 | 0 | 0 | 0 | 0 | 0 | 0 | 0 | 0 |
| 0 | 0 | 0 | 1 | 0 | 0 | 0 | 0 | 0 | 0 | 1 | 1 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 |
| 0 | 0 | 1 | 0 | 0 | 0 | 0 | 0 | 0 | 0 | -1 | 0 | -1 | 0 | 0 | 0 | 0 |
| 0 | 0 | 0 | 0 | 0 | 0 | 0 | 0 | 0 | 0 | 0 | 0 | 1 | 0 | 0 | 0 | 0 |
| 0 | 0 | 0 | 0 | 0 | 1 | 1 | 0 | 0 | 0 | 0 | 0 | 0 | 0 | 0 | 0 | -1 |
| 1 | 0 | 0 | 0 | 0 | 0 | 0 | 0 | 0 | 0 | 1 | 0 | 0 | -1 | 0 | 0 | 0 |
| 0 | 0 | 0 | -1 | 0 | 0 | 0 | 0 | -1 | 0 | 0 | 0 | 0 | 0 | 0 | -1 | 0 |
| 1 | 0 | -1 | 0 | 0 | 0 | 0 | 0 | 0 | 0 | 0 | 0 | 0 | 0 | -1 | 0 | 0 |
| 0 | 0 | 0 | 0 | 0 | 1 | 0 | 1 | 0 | 0 | 0 | 0 | 0 | -1 | 0 | 0 | 0 |
| 0 | 0 | 0 | 0 | 0 | 0 | 0 | 0 | 0 | 0 | 0 | 0 | 1 | 0 | 0 | 0 | 0 |
| 1 | -1 | 0 | 0 | 0 | -1 | -1 | 0 | 0 | 0 | 0 | 0 | 0 | 0 | 0 | 0 | 1 |
| 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 1 | 0 | 0 |
| 1 | 0 | 0 | 0 | 1 | 0 | 0 | 1 | 0 | -1 | 0 | 0 | 0 | 0 | -1 | 0 | 0 |
| 0 | 0 | 0 | -1 | 0 | 1 | 0 | 0 | -1 | 0 | 0 | -1 | 0 | 0 | 0 | -1 | 0 |
| 0 | 0 | 0 | 0 | 1 | 0 | 0 | 0 | -1 | 0 | 0 | 0 | 0 | 1 | 0 | 0 | 0 |
| 1 | 0 | 0 | -1 | 0 | 0 | 0 | 0 | -1 | 0 | -1 | 0 | -1 | 0 | 0 | 0 | 0 |
| 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 1 |
| 0 | -1 | 0 | 0 | 0 | 0 | 0 | 0 | 0 | 1 | 0 | 0 | 0 | 0 | 0 | -1 | 0 |
| 0 | 1 | 1 | 0 | 0 | 1 | 0 | 1 | 0 | 0 | 0 | 0 | 0 | -1 | 0 | 0 | 0 |
| 0 | 0 | 1 | 0 | 0 | 0 | 0 | 1 | 0 | 0 | -1 | -1 | -1 | 0 | 0 | 0 | 0 |
| 0 | -1 | 0 | 0 | 0 | -1 | 0 | 0 | 1 | 1 | 0 | 0 | 0 | 0 | 0 | 0 | 1 |
| 0 | 0 | 0 | 1 | -1 | 0 | 0 | 0 | 0 | 0 | 0 | -1 | 0 | 0 | 0 | 0 | 0 |
| 0 | 0 | 0 | 0 | 0 | 0 | -1 | 0 | 0 | 0 | 1 | 0 | 1 | 0 | 0 | 0 | 0 |
| -1 | 0 | 0 | 0 | -1 | 0 | 1 | 0 | 0 | 1 | 0 | 0 | 0 | 0 | 1 | 0 | 0 |

TABLE 5B

A second Alternative Basis for Smirnov's <6, 3, 3; 40>-algorithm.

phi

| | | | | | | | | |
|---|---|---|---|---|---|---|---|---|
| −0.125 | −0.125 | 0 | −1 | 0 | 1 | 0 | 1 | 0 |
| 0.125 | 0.125 | 0 | 0 | 1 | 0 | −1 | 0 | 1 |
| 0 | 0 | −0.125 | 0 | 1 | 0 | −1 | 0 | 1 |
| −0.125 | 0.125 | 0 | 1 | 0 | −1 | 0 | 1 | 0 |
| −0.125 | 0.125 | 0 | 0 | −1 | 0 | −1 | 0 | 1 |
| 0 | 0 | 0.125 | 1 | 0 | 1 | 0 | 1 | 0 |
| 0 | 0 | 0.125 | 0 | −1 | 0 | −1 | 0 | −1 |
| 0.125 | −0.125 | 0 | 1 | 0 | 1 | 0 | 1 | 0 |
| 0 | 0 | −0.125 | 0 | 1 | 0 | 1 | 0 | −1 |
| 0 | 0 | −0.125 | 1 | 0 | 1 | 0 | −1 | 0 |
| −0.125 | −0.125 | 0 | 0 | 1 | 0 | −1 | 0 | −1 |
| −0.125 | −0.125 | 0 | 1 | 0 | 1 | 0 | −1 | 0 |
| 0 | 0 | 0.125 | 1 | 0 | 1 | 1 | 0 | −1 |
| −0.125 | −0.125 | 0 | −1 | 0 | 1 | 1 | 0 | −1 |
| −0.125 | 0.125 | 0 | −1 | 0 | −1 | −1 | 0 | 1 |
| −0.125 | −0.125 | 0 | 1 | 0 | 1 | −1 | 0 | −1 |
| −0.125 | −0.125 | 0 | 1 | 0 | 1 | 1 | 0 | −1 |
| 0.125 | 0.125 | 0 | 0 | −1 | 0 | 0 | 1 | 0 | phi

| | | | | | | | | |
|---|---|---|---|---|---|---|---|---|
| 0 | 1 | 1 | 0 | 0 | −0.125 | 1 | 0 | 0 |
| −1 | 0 | 0 | 0 | 0 | 0.125 | 0 | −1 | −1 |
| 0 | 1 | 1 | −0.125 | −0.125 | 0 | 1 | 0 | 0 |
| 0 | −1 | 1 | 0 | 0 | −0.125 | 1 | 0 | 0 |
| 1 | 0 | 0 | 0 | 0 | −0.125 | 0 | −1 | 1 |
| −1 | 0 | 0 | −0.125 | 0.125 | 0 | 0 | 1 | 1 |
| 0 | 1 | 1 | −0.125 | 0.125 | 0 | −1 | 0 | 0 |
| 0 | −1 | −1 | 0 | 0 | −0.125 | 1 | 0 | 0 |
| 0 | −1 | 1 | −0.125 | 0.125 | 0 | 1 | 0 | 0 |
| 1 | 0 | 0 | 0.125 | 0.125 | 0 | 0 | 1 | −1 |
| −1 | 0 | 0 | 0 | 0 | 0.125 | 0 | −1 | 1 |
| 0 | −1 | 1 | 0 | 0 | 0.125 | −1 | 0 | 0 |
| 0 | −1 | −1 | 0 | 0 | −0.125 | 0 | 1 | 1 |
| 1 | 0 | 0 | −0.125 | 0.125 | 0 | 1 | 0 | 0 |
| 1 | 0 | 0 | 0.125 | −0.125 | 0 | −1 | 0 | 0 |
| −1 | 0 | 0 | −0.125 | 0.125 | 0 | −1 | 0 | 0 |
| 1 | 0 | 0 | 0.125 | 0.125 | 0 | −1 | 0 | 0 |
| 0 | 1 | −1 | 0.125 | −0.125 | 0 | 0 | 1 | −1 | psi

| | | | | | | | | |
|---|---|---|---|---|---|---|---|---|
| 1 | 0 | 1 | 0 | 1 | 1 | −1 | 1 | 0 |
| 1 | 0 | −1 | 0 | 1 | −1 | −1 | 1 | 0 |
| −1 | 0 | −1 | 0 | 1 | −1 | 1 | 1 | 0 |
| 1 | 0 | 1 | 0 | 1 | −1 | −1 | −1 | 0 |
| 1 | 0 | 1 | 0 | −1 | 1 | 1 | 1 | 0 |
| 1 | 0 | −1 | 0 | 1 | 1 | 1 | 1 | 0 |
| −1 | 0 | −1 | −1 | 0 | −1 | 0 | 0 | 0 |
| 1 | 0 | 1 | 0 | 0 | 0 | −1 | 0 | −1 |
| 0 | 1 | −1 | 0 | 1 | −1 | 0 | 0 | 0 | upsilon

| | | | | | | | | |
|---|---|---|---|---|---|---|---|---|
| 0 | 0 | 0 | 0 | 0 | 0 | −2 | 2 | 0 |
| 0 | 0.25 | −0.25 | −2 | 2 | 0 | 0 | 0 | 0 |
| −0.25 | 0 | −0.25 | 2 | 2 | 0 | 0 | 0 | 0 |
| 0.25 | 0 | −0.25 | 0 | 0 | 0 | 2 | 0 | −2 |
| −0.25 | 0 | −0.25 | 2 | 0 | 2 | 0 | 0 | 0 |
| 0 | 0.25 | −0.25 | 0 | 0 | 0 | 0 | 2 | −2 |
| 0 | 0 | 0 | 0 | −2 | −2 | 0 | 0 | 0 |
| 0 | 0 | 0 | 0 | 0 | 0 | 0 | 2 | −2 |
| 0 | 0 | 0 | 2 | 0 | −2 | 0 | 0 | 0 |
| 0 | 0 | 0 | 0 | 0 | 0 | −2 | 0 | −2 |
| 0.25 | 0.25 | 0 | 0 | 0 | 0 | 2 | 2 | 0 |
| 0 | 0.25 | 0.25 | 0 | 2 | 2 | 0 | 0 | 0 |
| 0 | 0 | 0 | −2 | −2 | 0 | 2 | 2 | 0 |
| 0 | 0 | 0 | −2 | 2 | 0 | 2 | −2 | 0 |
| 0.25 | 0 | −0.25 | 2 | 0 | −2 | 2 | 0 | −2 |
| 0 | −0.25 | 0.25 | 0 | 0 | 0 | 0 | 0 | 0 |
| 0 | −0.25 | −0.25 | 0 | 0 | 0 | 0 | 0 | 0 |
| −0.25 | 0 | −0.25 | 2 | 0 | 2 | 2 | 0 | 2 |

TABLE 5B-continued

A second Alternative Basis for Smirnov's <6, 3, 3; 40>-algorithm.

upsilon

| | | | | | | | | |
|---|---|---|---|---|---|---|---|---|
| −2 | 2 | 0 | 0.25 | −0.25 | 0 | 0 | 0 | 0 |
| 0 | −2 | 2 | −0.25 | 0 | 0.25 | 2 | 0 | −2 |
| 2 | 0 | 2 | 0 | −0.25 | 0.25 | 0 | 2 | −2 |
| 0 | 0 | 0 | 0 | 0 | 0 | −2 | 0 | 2 |
| 2 | 0 | 2 | 0 | 0 | 0 | 0 | 0 | 0 |
| 0 | 0 | 0 | 0 | 0 | 0 | 0 | 2 | −2 |
| 0 | 0 | 0 | 0 | 0.25 | 0.25 | 0 | 2 | 2 |
| 0 | −2 | 2 | 0 | −0.25 | 0.25 | 0 | 0 | 0 |
| 0 | 0 | 0 | 0.25 | 0 | −0.25 | −2 | 0 | 2 |
| −2 | 0 | −2 | 0.25 | 0 | 0.25 | 0 | 0 | 0 |
| 0 | 0 | 0 | 0 | 0 | 0 | −2 | −2 | 0 |
| 0 | 2 | 2 | 0 | 0 | 0 | 0 | 0 | 0 |
| −2 | −2 | 0 | 0 | 0 | 0 | −2 | −2 | 0 |
| 2 | −2 | 0 | 0 | 0 | 0 | 2 | −2 | 0 |
| 0 | 0 | 0 | 0.25 | 0 | 0.25 | 0 | 0 | 0 |
| 0 | 2 | −2 | 0 | 0.25 | −0.25 | 0 | −2 | 2 |
| 0 | −2 | −2 | 0 | 0.25 | 0.25 | 0 | 2 | 2 |
| 0 | 0 | 0 | −0.25 | 0 | −0.25 | 0 | 0 | 0 |

U

| | | | | | | | | | | | | | | | | |
|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 |
| 0 | 0 | 0 | −1 | 1 | 0 | 0 | 0 | 1 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 |
| 0 | 0 | 0 | 0 | 0 | 0 | 0 | 0 | 0 | 1 | 1 | −1 | 0 | 0 | 0 | 0 | 0 |
| 1 | 1 | 1 | 0 | 0 | 0 | 0 | 0 | 0 | 0 | 0 | 0 | 0 | 0 | 0 | 0 | 0 |
| 0 | 0 | 0 | 0 | 0 | 1 | −1 | −1 | 0 | 0 | 0 | 0 | 0 | 0 | 0 | 0 | 0 |
| 0 | 0 | 1 | 0 | 0 | 0 | 0 | −1 | 0 | 0 | 0 | 1 | 0 | 0 | 0 | 0 | 0 |
| −1 | 0 | 1 | 1 | 0 | 0 | 0 | 0 | −1 | 0 | 0 | 0 | 1 | 0 | 0 | 0 | 0 |
| 0 | 1 | 0 | 0 | 0 | −1 | 0 | 0 | 0 | 0 | 0 | 1 | 0 | 0 | 0 | 0 | 0 |
| −1 | 0 | 1 | 0 | 0 | 0 | 0 | 0 | 0 | −1 | −1 | 0 | 0 | 0 | 0 | 1 | 0 |
| 0 | 0 | 0 | 0 | 0 | 1 | 0 | 0 | 1 | 0 | 0 | 0 | 0 | 1 | 0 | 0 | 0 |
| 0 | 0 | 1 | 0 | 0 | 0 | 0 | 0 | 0 | −1 | 0 | 0 | 0 | 0 | 0 | 1 | 0 |
| 0 | 0 | 0 | 0 | 0 | 0 | 0 | 0 | 0 | 0 | 0 | 1 | 0 | 0 | 0 | 0 | 0 |
| 1 | 1 | 0 | 0 | 0 | −1 | 1 | 0 | 0 | 0 | 0 | 0 | 1 | 0 | 0 | 0 | 0 |
| 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 0 | 0 | 0 | 0 | 0 | 0 | 0 | 1 | 0 | 0 |
| −1 | 0 | 0 | 1 | −1 | 0 | 0 | 0 | −1 | 0 | 0 | 0 | 1 | 0 | 0 | 0 | 0 |
| 0 | 0 | 0 | 0 | 0 | 0 | −1 | 0 | 0 | 0 | −1 | 0 | 0 | 0 | 0 | 1 | 0 |
| 0 | 0 | 0 | 0 | 0 | 1 | 0 | 0 | 0 | 0 | 0 | 1 | 0 | 0 | 0 | −1 | 0 |
| 0 | 0 | 0 | 0 | 0 | 0 | 0 | 0 | 1 | 0 | 0 | 1 | 0 | 0 | 0 | 0 | 1 |
| 0 | 0 | 0 | 1 | −1 | 0 | 0 | 0 | −1 | 0 | −1 | 0 | 0 | 0 | 0 | 0 | −1 |
| 0 | 1 | 0 | 0 | 0 | 0 | 0 | 0 | −1 | 0 | 0 | 0 | 1 | 0 | 0 | 0 | 0 |
| 0 | 0 | 0 | 0 | 0 | 0 | 0 | 0 | 0 | 0 | 0 | 0 | 0 | 1 | 0 | 0 | 0 |
| 0 | 1 | 0 | 0 | 0 | 0 | 0 | 0 | 0 | 0 | −1 | 0 | 0 | 0 | 0 | 1 | 0 |
| 0 | 0 | 0 | 0 | 0 | 0 | 0 | 0 | 0 | 0 | 0 | 0 | 0 | 0 | 1 | 0 | 0 |
| 0 | 0 | 0 | 0 | 0 | 0 | −1 | −1 | 0 | −1 | −1 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 1 |
| 0 | 0 | 0 | 0 | −1 | 0 | 0 | 0 | −1 | 1 | 0 | −1 | 0 | 0 | 0 | 0 | −1 |
| 0 | 0 | 0 | −1 | 0 | 0 | 1 | 1 | 1 | 0 | 0 | 0 | 0 | 1 | 0 | 0 | 0 |
| 0 | 0 | 0 | 0 | −1 | 0 | 0 | 1 | 0 | 0 | 0 | 0 | 0 | 1 | 0 | 0 | 0 |

V

| | | | | | | | | |
|---|---|---|---|---|---|---|---|---|
| 1 | 0 | 0 | 0 | 0 | 0 | 0 | 0 | 0 |
| 0 | 1 | 0 | 0 | 0 | 0 | 0 | 0 | 0 |
| 0 | 0 | 1 | 0 | 0 | 0 | 0 | 0 | 0 |
| 0 | 0 | 0 | 1 | 0 | 1 | −1 | 0 | 0 |
| 0 | 0 | 0 | 0 | 1 | 0 | 0 | 0 | 0 |
| 1 | 0 | 1 | 0 | 0 | −1 | 0 | 0 | 0 |
| 1 | 0 | 0 | −1 | −1 | 0 | 0 | 0 | 0 |
| 0 | 0 | 1 | 1 | 1 | 0 | 0 | 0 | 0 |
| 0 | −1 | 1 | 1 | 0 | 0 | 0 | 0 | 0 |
| 0 | −1 | 0 | 0 | −1 | 1 | 0 | 0 | 0 |
| 0 | 0 | 0 | 0 | 1 | 0 | 0 | 0 | 0 |
| 0 | −1 | 0 | 1 | 0 | 1 | 0 | 0 | 0 |

TABLE 5B-continued

A second Alternative Basis for Smirnov's <6, 3, 3; 40>-algorithm.

| | | | | | | | | |
|---|---|---|---|---|---|---|---|---|
| 1 | 0 | 0 | −1 | 0 | −1 | 0 | 0 | 0 |
| 1 | −1 | 0 | 0 | −1 | 0 | 0 | 0 | 0 |
| 1 | −1 | 1 | 0 | 0 | 0 | 0 | 0 | 0 |
| 0 | 0 | 0 | 0 | 0 | 1 | 0 | 0 | 0 |
| 0 | 0 | −1 | 0 | 0 | 0 | 1 | 0 | 0 |
| 0 | 0 | −1 | 0 | 0 | 0 | 0 | 0 | 1 |
| 1 | 0 | 0 | 0 | 0 | 0 | 1 | 0 | 0 |
| 1 | −1 | 0 | 0 | 0 | 0 | 0 | 0 | 1 |
| 0 | 0 | 1 | 0 | 0 | −1 | −1 | 0 | 0 |
| 0 | 0 | 0 | 0 | 0 | 0 | 1 | 0 | 0 |
| 0 | 0 | −1 | 0 | 0 | 0 | 0 | −1 | 0 |
| −1 | 0 | 0 | 0 | 0 | 0 | 0 | 1 | 0 |
| 0 | −1 | 0 | 0 | 0 | 0 | 0 | 0 | 1 |
| 0 | 0 | 1 | 1 | 0 | 0 | 0 | 0 | −1 |
| 0 | 0 | 0 | 0 | 0 | 0 | 0 | 1 | 0 |
| 0 | 0 | 0 | −1 | −1 | 0 | 0 | 1 | 0 |
| −1 | 0 | 0 | 0 | 0 | 1 | 0 | 1 | 0 |
| 0 | 0 | 0 | 1 | 0 | 0 | 0 | −1 | 0 |
| 0 | 1 | 1 | 0 | 1 | −1 | 0 | −1 | 0 |
| 0 | 1 | −1 | 0 | 0 | 0 | 0 | −1 | 0 |
| −1 | 0 | 0 | 1 | 0 | 1 | 0 | 0 | −1 |
| −1 | 1 | 0 | 0 | 0 | 0 | −1 | 0 | 0 |
| 0 | 0 | 0 | 0 | 0 | 0 | 0 | 0 | 1 |
| 0 | 0 | 0 | 0 | 1 | 0 | 0 | 0 | 1 |
| 0 | −1 | 0 | 1 | 0 | 1 | 1 | 0 | 0 |
| 0 | 0 | 0 | 0 | 1 | 0 | 1 | 0 | 0 |
| 0 | 0 | 0 | 0 | −1 | 1 | 0 | 0 | −1 |
| 0 | 0 | 0 | −1 | −1 | 0 | −1 | 0 | 0 |

| W | | | | | | | | | | | | | | | | | |
|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 |
| 0 | 0 | 0 | 0 | 1 | 0 | 0 | 0 | 0 | 0 | 0 | 0 | 0 | 0 | 0 | 0 | 0 | 0 |
| 0 | 0 | 0 | 0 | 0 | 1 | 0 | 0 | 0 | 0 | 0 | 0 | 0 | 0 | 0 | 0 | 0 | 0 |
| 0 | 0 | 0 | 0 | 0 | 0 | 1 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 0 | 0 | 0 | 0 | 0 |
| 0 | 0 | 0 | 0 | 0 | 0 | 0 | 0 | 1 | 0 | 0 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 |
| 0 | 0 | 1 | 0 | 1 | 0 | 0 | 1 | 0 | 0 | 0 | 0 | 0 | 0 | 0 | 0 | 0 | 0 |
| 1 | 0 | 0 | 0 | 0 | 0 | −1 | 0 | 0 | 1 | 0 | 0 | 0 | 0 | 0 | 0 | 0 | 0 |
| 0 | 1 | 0 | 0 | 0 | 1 | 0 | 0 | −1 | 0 | 0 | 0 | 0 | 0 | 0 | 0 | 0 | 0 |
| 0 | 0 | 0 | 1 | 0 | 0 | 0 | 0 | 0 | 1 | 1 | 0 | 0 | 0 | 0 | 0 | 0 | 0 |
| 0 | 0 | 0 | 0 | 0 | 0 | 0 | 0 | 0 | 1 | 0 | 0 | 0 | 0 | 0 | 0 | 0 | 0 |
| 0 | 0 | 0 | 0 | 0 | 0 | 0 | 0 | 0 | 0 | 1 | 0 | 0 | 0 | 0 | 0 | 0 | 0 |
| 0 | 0 | 0 | 0 | 0 | 0 | 0 | 0 | 0 | 0 | 0 | 1 | 0 | 0 | 0 | 0 | 0 | 0 |
| 0 | 0 | 1 | 0 | 0 | 0 | 0 | 0 | 0 | −1 | 0 | −1 | 0 | 0 | 0 | 0 | 0 | 0 |
| 0 | 0 | 0 | 0 | 0 | 0 | 0 | 0 | 0 | 0 | 0 | 0 | 1 | 0 | 0 | 0 | 0 | 0 |
| 1 | 0 | 0 | 0 | 0 | 0 | −1 | 0 | 0 | 0 | 1 | 1 | 0 | 0 | 0 | −1 | 0 | 0 |
| 0 | 0 | 0 | 0 | 0 | 0 | 0 | 0 | 0 | 0 | 0 | 0 | 0 | 1 | 0 | 0 | 0 | 0 |
| 1 | 0 | −1 | 0 | −1 | 0 | 0 | 0 | 0 | 1 | 0 | 0 | 0 | 0 | 0 | 0 | 0 | −1 |
| 0 | −1 | −1 | 0 | 0 | 0 | 0 | 0 | 0 | 0 | 0 | 0 | 0 | 0 | 1 | 0 | 0 | 0 |
| 0 | 0 | 0 | 0 | 0 | 0 | 1 | 0 | 0 | 0 | 0 | −1 | 0 | 0 | 0 | 0 | 1 | 0 |
| 1 | −1 | 0 | 0 | 0 | 0 | 0 | 0 | 0 | 0 | 0 | 0 | −1 | 0 | 0 | 0 | 0 | 0 |
| 0 | 1 | 1 | 0 | 0 | 1 | 0 | 1 | 0 | 0 | 0 | 0 | 0 | 0 | 0 | −1 | 0 | 0 |
| 0 | 0 | 0 | 0 | 1 | 0 | 0 | 0 | 0 | −1 | 0 | 0 | 0 | 0 | 0 | 0 | 0 | 1 |
| 0 | 0 | 0 | 0 | 0 | 0 | 1 | 1 | 0 | 0 | 0 | 0 | 0 | 0 | 0 | 0 | 0 | −1 |
| 0 | 0 | 0 | 0 | 1 | 0 | 0 | 0 | 0 | 0 | −1 | 0 | 0 | 1 | 0 | 0 | 0 | 0 |
| 0 | 1 | 1 | 0 | 1 | 1 | 0 | 1 | −1 | 0 | 0 | 0 | 0 | 0 | −1 | 0 | 0 | 0 |
| 0 | 0 | 0 | −1 | 0 | 0 | 0 | 0 | −1 | 0 | 0 | 0 | 0 | 0 | 0 | −1 | 0 | 0 |
| 0 | 0 | 0 | −1 | 0 | 0 | 0 | −1 | 0 | 0 | 0 | 0 | 0 | −1 | 0 | 0 | 0 | 0 |
| 0 | 0 | 0 | 0 | 0 | 1 | 1 | 0 | 0 | 0 | 0 | 0 | −1 | 0 | 0 | 0 | 0 | 0 |
| 0 | −1 | 0 | 1 | 0 | 0 | 0 | 0 | 1 | 0 | 1 | 0 | 0 | 1 | 0 | 0 | 0 | 0 |
| 0 | 0 | 0 | 0 | 0 | 0 | 0 | 0 | 0 | 0 | 0 | 0 | 0 | 0 | 1 | 0 | 0 | 0 |
| 0 | 0 | 0 | 0 | 0 | 0 | 0 | 1 | 0 | 0 | 0 | −1 | 1 | 0 | 0 | 0 | 0 | 0 |
| 1 | −1 | 0 | 0 | 0 | 0 | 0 | 1 | 1 | 0 | 0 | 0 | −1 | 0 | 0 | 0 | 0 | 0 |
| 0 | 0 | −1 | 1 | −1 | 0 | 0 | 0 | 0 | 1 | 0 | 1 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 0 | 0 | 0 | 0 | 0 | 0 | 1 |

EXPERIMENTAL RESULTS

Experimental results for aspects of embodiments of a $\langle 2,2,2; 7\rangle_{\psi_{opt}}$-algorithm follow (TABLE 6). All experiments were conducted on a single compute node of the High-Performance Computing Center Stuttgart's Hazel Hen, a Cray® XC40 system, with two 12-core (24 threads) Intel® Xeon® CPU E5-2680 v3 and 128 GB of memory.

TABLE 6

Fast matrix multiplication algorithms with 2 × 2 base case.

| Algorithm | Additions | Arithmetic Computations | I/O-Complexity |
|---|---|---|---|
| Strassen | 18 | $7n^{log_2 7} - 6n^2$ | $6 \cdot \left(\frac{\sqrt{3} \cdot n}{\sqrt{M}}\right)^{log_2 7} \cdot M - 18n^2 + 3M$ |
| Strassen-Winograd | 15 | $6n^{log_2 7} - 5n^2$ | $5 \cdot \left(\frac{\sqrt{3} \cdot n}{\sqrt{M}}\right)^{log_2 7} \cdot M - 15n^2 + 3M$ |
| Disclosed herein | 12 | $5n^{log_2 7} - 4n^2 + 3n^2 log_2 n$ | $4 \cdot \left(\frac{\sqrt{3} \cdot n}{\sqrt{M}}\right)^{log_2 7} \cdot M - 12n^2 + 3n^2 \cdot log_2\left(\sqrt{2} \cdot \frac{n}{\sqrt{M}}\right) 5M$ |

The experiments employed a straightforward implementation of both the present algorithm and Strassen-Winograd's algorithm using Open Multi-Processing application programming interface. Each algorithm ran for a pre-selected number of recursive steps before switching to Intel®'s MKL DGEMM routine. Each DGEMM call uses all threads, matrix additions are always fully parallelized. All results are the median over 6 experiments.

Figure 3:
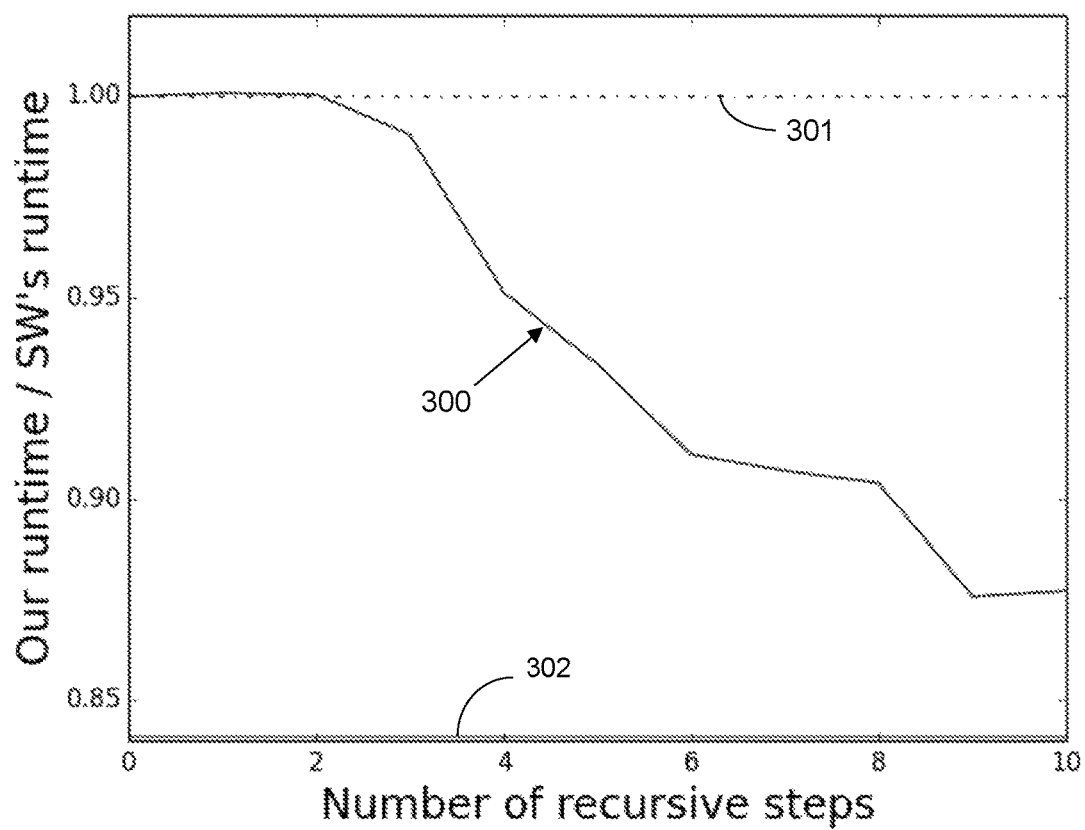
FIG. 3 shows a graph of experimental results of a $\langle 2,2,2; 7 \rangle$-algorithm matrix multiplication using an alternative basis transform.

Reference is now made to FIG. 3, which shows a graph of experimental results of a $\langle 2,2,2; 7\rangle$-algorithm matrix multiplication using an alternative basis transform. Graph 300 compares the performance of the alternative basis transform $\langle 2,2,2; 7\rangle_{\psi_{opt}}$-algorithm to Strassen-Winograd's on square matrices of fixed dimension N=32768. Graph 300 shows the alternative basis transform algorithm's runtime, normalized by Strassen-Winograd's algorithm's runtime, as a function of the number of recursive steps taken before switching to Intel's MKL DGEMM. The top horizontal line 301 (at 1.0) represents Strassen-Winograd's performance and the bottom horizontal line 302 (at 0.83) represents the theoretical ratio when taking the maximal number of recursive steps. Graph 300 shows the relative improvement of the disclosed technique over Strassen-Winograd's technique. With increasing each recursive step, the relative improvement nears the theoretical improvement of 0.83.

The resulting alternative basis Strassen-like algorithms are summarized in TABLE 7. Note, particularly, our alternative basis version of Smirnov's $\langle 6,3,3; 40\rangle$-algorithm, which is asymptotically faster than Strassen's, where the reduced the number of linear operations in the bilinear-recursive algorithm were reduced from 1246 to 202, thus reducing the leading coefficient by 83.2%.

TABLE 7

Alternative Basis Algorithm Results

| Algorithm | Linear Operations | Improved Linear Operations | Arithmetic Leading Coefficient | Improved Leading Coefficient | Computations Saved |
|---|---|---|---|---|---|
| $\langle 2, 2, 2; 7\rangle$ | 15 | 12 | 6 | 5 | 16.6% |
| $\langle 3, 2, 3; 15\rangle$ | 64 | 52 | 15.06 | 7.94 | 47.3% |
| $\langle 2, 3, 4; 20\rangle$ | 78 | 58 | 9.96 | 7.46 | 25.6% |
| $\langle 3, 3, 3; 23\rangle$ | 87 | 75 | 8.91 | 6.57 | 26.3% |
| $\langle 6, 3, 3; 40\rangle$ | 1246 | 202 | 55.63 | 9.39 | 83.2% |

The present method obtained novel variants of existing Strassen-like algorithms, reducing the number of linear operations required. The present algorithm also outperforms Strassen-Winograd's algorithm for any matrix dimension n≥32. Furthermore, we have obtained an alternative basis algorithm of Smirnov's $\langle 6,3,3; 40\rangle$-algorithm, reducing the number of additions by 83.8%. While the problem of finding bases which optimally sparsify an algorithm's encoding/decoding matrices is NP-Hard (see Section 5), it is still solvable for many fast matrix multiplication algorithms with small base cases. Hence, finding basis transformations could be done in practice using search heuristics, leading to further improvements.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Rather, the computer readable storage medium is a non-transient (i.e., not-volatile) medium.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions and/or hardware.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computerized method comprising:
operating at least one hardware processor for:
receiving a first matrix and a second matrix;
determining a basis transformation, wherein the basis transformation is invertible to an inverted basis transformation;
computing an alternative basis first matrix by multiplying the first matrix by the basis transformation;
computing an alternative basis second matrix by multiplying the second matrix by the basis transformation;
performing a matrix multiplication of the alternative basis first matrix and the alternative basis second matrix, thereby producing an alternative basis multiplied matrix, wherein the matrix multiplication is configured for the basis transformation; and
computing a multiplied matrix by multiplying the alternative basis multiplied matrix by the inverted basis transformation.

2. The method according to claim 1, wherein the basis transformation is determined by at least one of a heuristic, a computation, and a retrieval from a repository.

3. The method according to claim 1, wherein the basis transformation is determined by solving at least one sparsification problem.

4. The method according to claim 3, wherein the matrix multiplication comprises (i) a first encoding matrix for encoding the first matrix, (ii) a second encoding matrix for encoding the second matrix, and (iii) a decoding matrix for the alternative basis multiplied matrix, wherein the at least one sparsification problem is at least one from the group consisting of sparsification of the first encoding matrix, sparsification of the second encoding matrix, and sparsification of the decoding matrix.

5. The method according to claim 4, wherein the basis transformation is determined by simultaneously solving three sparsification problems, one for each of: the first encoding matrix, the second encoding matrix, and the decoding matrix.

6. The method according to claim 1, wherein each element of the basis transformation comprises one number from the group consisting of the numbers 1, 0, and −1.

7. The method according to claim 1, wherein the basis transformation is computed to sparsify encoding and decoding matrices of a specific matrix multiplication algorithm.

8. A computer program product, the computer program product comprising a non-transitory computer-readable storage medium having program code embodied therewith, the program code executable by at least one hardware processor to:
receive a first matrix and a second matrix;
determine a basis transformation, wherein the basis transformation is invertible to an inverted basis transformation;
compute an alternative basis first matrix by multiplying the first matrix by the basis transformation;
compute an alternative basis second matrix by multiplying the second matrix by the basis transformation;
perform a matrix multiplication of the alternative basis first matrix and the alternative basis second matrix, thereby producing an alternative basis multiplied matrix, wherein the matrix multiplication is configured for the basis transformation; and
compute a multiplied matrix by multiplying the alternative basis multiplied matrix by the inverted basis transformation.

9. The computer program product according to claim 8, wherein the basis transformation is determined by at least one of a heuristic, a computation, and a retrieval from a repository.

10. The computer program product according to claim 8, wherein the basis transformation is determined by solving at least one sparsification problem.

11. The computer program product according to claim 10, wherein the matrix multiplication comprises (i) a first encoding matrix for encoding the first matrix, (ii) a second encoding matrix for encoding the second matrix, and (iii) a decoding matrix for the alternative basis multiplied matrix, wherein the at least one sparsification problem is at least one from the group consisting of sparsification of the first encoding matrix, sparsification of the second encoding matrix, and sparsification of the decoding matrix.

12. The computer program product according to claim 11, wherein the basis transformation is determined by simultaneously solving three sparsification problems, one for each of: the first encoding matrix, the second encoding matrix, and the decoding matrix.

13. The computer program product according to claim 8, wherein each element of the basis transformation comprises one number from the group consisting of the numbers 1, 0, and −1.

14. The computer program product according to claim 8, wherein the basis transformation is computed to sparsify encoding and decoding matrices of a specific matrix multiplication algorithm.

15. A computerized system, comprising:
at least one hardware processor;
a non-transitory computer-readable storage medium having program code embodied therewith, the program code executable by at least one hardware processor to:
receive a first matrix and a second matrix;
determine a basis transformation, wherein the basis transformation is invertible to an inverted basis transformation;
compute an alternative basis first matrix by multiplying the first matrix by the basis transformation;
compute an alternative basis second matrix by multiplying the second matrix by the basis transformation;
perform a matrix multiplication of the alternative basis first matrix and the alternative basis second matrix, thereby producing an alternative basis multiplied matrix, wherein the matrix multiplication is configured for the basis transformation; and
compute a multiplied matrix by multiplying the alternative basis multiplied matrix by the inverted basis transformation.

16. The system according to claim 15, wherein the basis transformation is determined by at least one of a heuristic, a computation, and a retrieval from a repository.

17. The system according to claim 15, wherein the basis transformation is determined by solving at least one sparsification problem.

18. The system according to claim 17, wherein the matrix multiplication comprises (i) a first encoding matrix for encoding the first matrix, (ii) a second encoding matrix for encoding the second matrix, and (iii) a decoding matrix for the alternative basis multiplied matrix, wherein the at least one sparsification problem is at least one from the group consisting of sparsification of the first encoding matrix, sparsification of the second encoding matrix, and sparsification of the decoding matrix.

19. The system according to claim 18, wherein the basis transformation is determined by simultaneously solving three sparsification problems, one for each of: the first encoding matrix, the second encoding matrix, and the decoding matrix.

20. The system according to claim 15, wherein each element of the basis transformation comprises one number from the group consisting of the numbers 1, 0, and −1.

* * * * *